United States Patent
Yamayoshi et al.

(10) Patent No.: US 9,564,459 B2
(45) Date of Patent: Feb. 7, 2017

(54) LIQUID CRYSTAL DISPLAY PANEL AND METHOD FOR MANUFACTURING LIQUID CRYSTAL DISPLAY PANEL

(71) Applicant: Mitsubishi Electric Corporation, Tokyo (JP)

(72) Inventors: Kazushi Yamayoshi, Kumamoto (JP); Takeshi Sonoda, Kumamoto (JP); Shinsuke Ogata, Kumamoto (JP)

(73) Assignee: Mitsubishi Electric Corporation, Tokyo (JP)

( * ) Notice: Subject to any disclaimer, the term of this patent is extended or adjusted under 35 U.S.C. 154(b) by 41 days.

(21) Appl. No.: 14/534,513

(22) Filed: Nov. 6, 2014

(65) Prior Publication Data

US 2015/0138481 A1    May 21, 2015

(30) Foreign Application Priority Data

Nov. 20, 2013   (JP) ................. 2013-239443

(51) Int. Cl.
| | |
|---|---|
| G02F 1/1362 | (2006.01) |
| G02F 1/1333 | (2006.01) |
| G02F 1/1368 | (2006.01) |
| H01L 21/027 | (2006.01) |
| H01L 27/12 | (2006.01) |
| H01L 21/3105 | (2006.01) |
| G02F 1/1343 | (2006.01) |

(52) U.S. Cl.
CPC ..... *H01L 27/1288* (2013.01); *G02F 1/136227* (2013.01); *G02F 2001/134372* (2013.01); *H01L 21/0274* (2013.01); *H01L 21/31058* (2013.01); *H01L 27/124* (2013.01)

(58) Field of Classification Search
None
See application file for complete search history.

(56) References Cited

U.S. PATENT DOCUMENTS

| | | | |
|---|---|---|---|
| 8,760,595 B2 | 6/2014 | Choi et al. | |
| 8,852,975 B2 | 10/2014 | Shin et al. | |
| 2007/0171319 A1 | 7/2007 | Fujita et al. | |
| 2013/0063673 A1 | 3/2013 | Choi et al. | |
| 2013/0126876 A1* | 5/2013 | Shin .................... | H01L 29/6675 257/59 |

(Continued)

FOREIGN PATENT DOCUMENTS

| | | |
|---|---|---|
| JP | 2007-226175 A | 9/2007 |
| JP | 2013-109347 A | 6/2013 |

*Primary Examiner* — Ashok Patel
(74) *Attorney, Agent, or Firm* — Studebaker & Brackett PC

(57) ABSTRACT

The organic insulating film has an opening through which the drain electrode is partially exposed. The opening has a side wall extending from above the drain electrode. The pixel electrode has a contact portion that is in contact with the drain electrode in the opening of the organic insulating film, a wiring portion that extends directly on the side wall of the organic insulating film from the contact portion, and a body portion that is linked to the wiring portion and is located on the organic insulating film. The interlayer insulating film covers the pixel electrode. The interlayer insulating film covers the source electrode and directly covers the semiconductor film between the source-electrode side surface and the drain-electrode side surface. The common electrode has fringes opposed to the pixel electrode via the interlayer insulating film.

19 Claims, 25 Drawing Sheets

(56) References Cited

U.S. PATENT DOCUMENTS

2013/0256678 A1* 10/2013 Nishikawa ............ H01L 27/124
 257/72
2015/0273865 A1* 10/2015 Kubota ................. B41J 3/4075
 283/81

* cited by examiner

F I G. 2
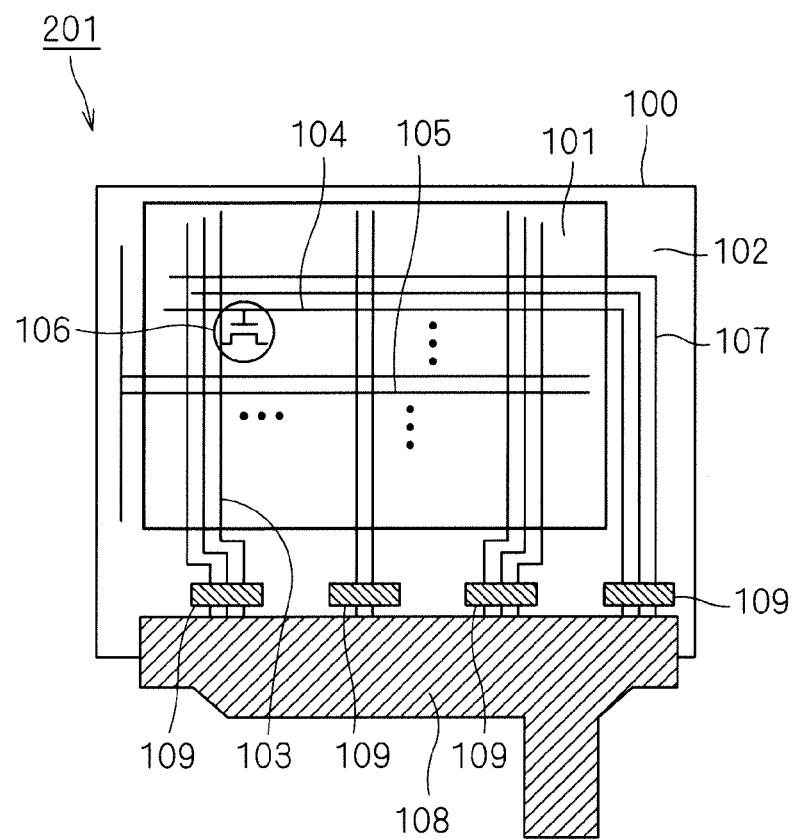

F I G . 5
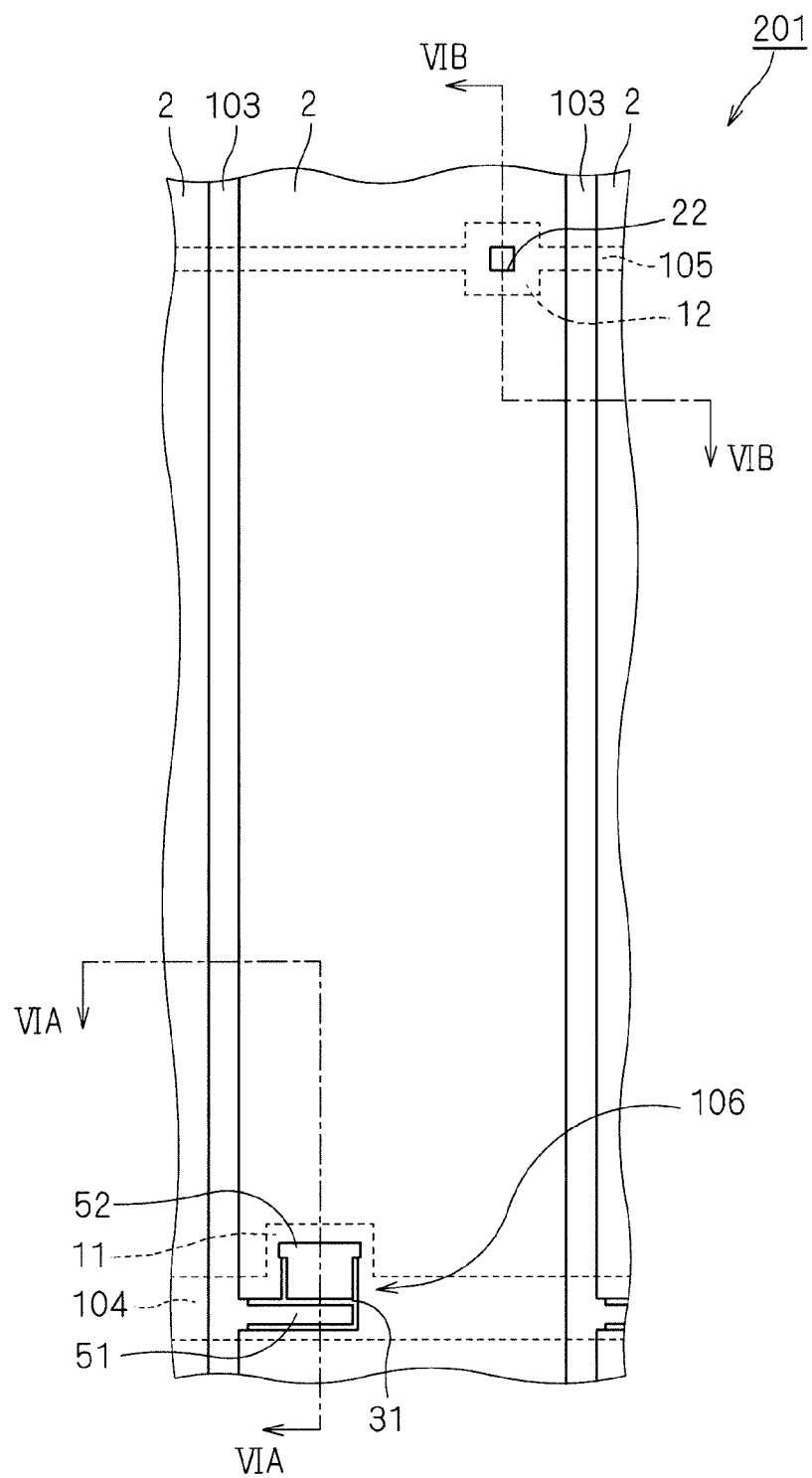

F I G. 8 A
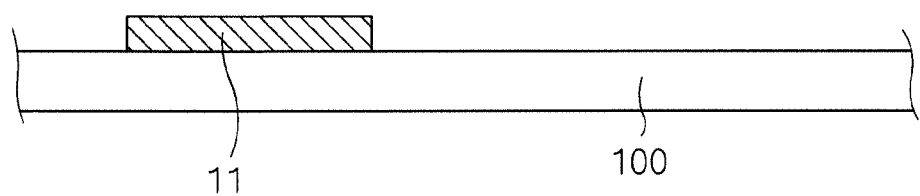
F I G. 8 B
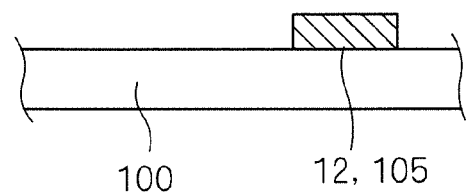

F I G. 2 0 A
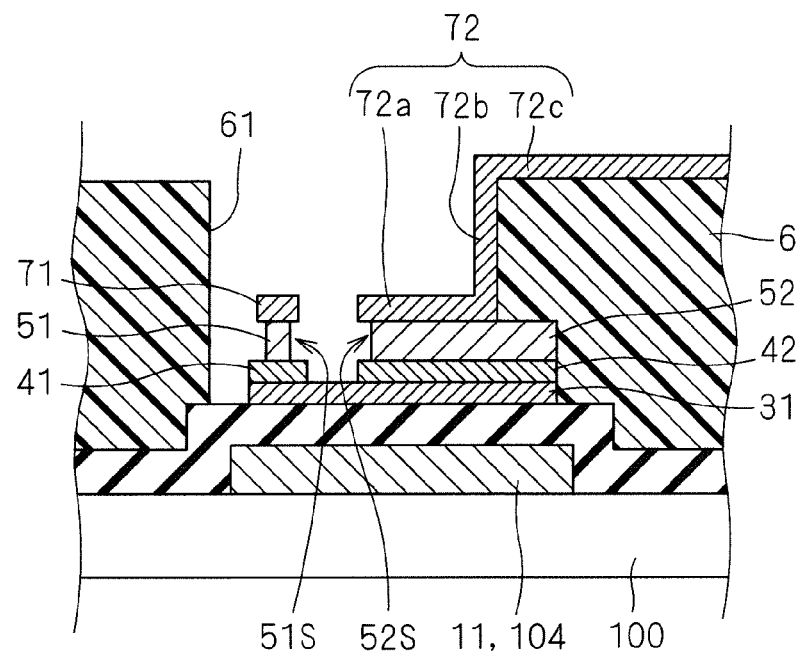
F I G. 2 0 B
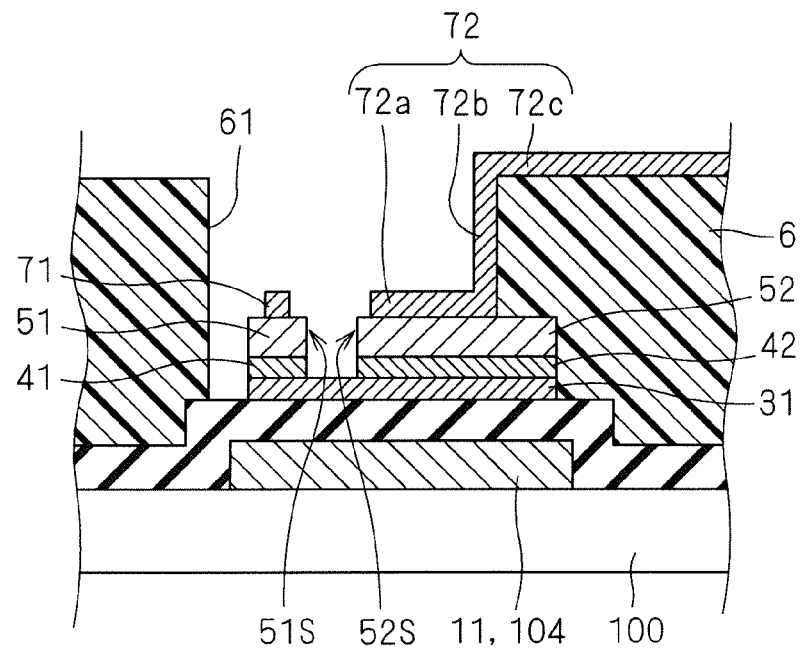

F I G . 2 1
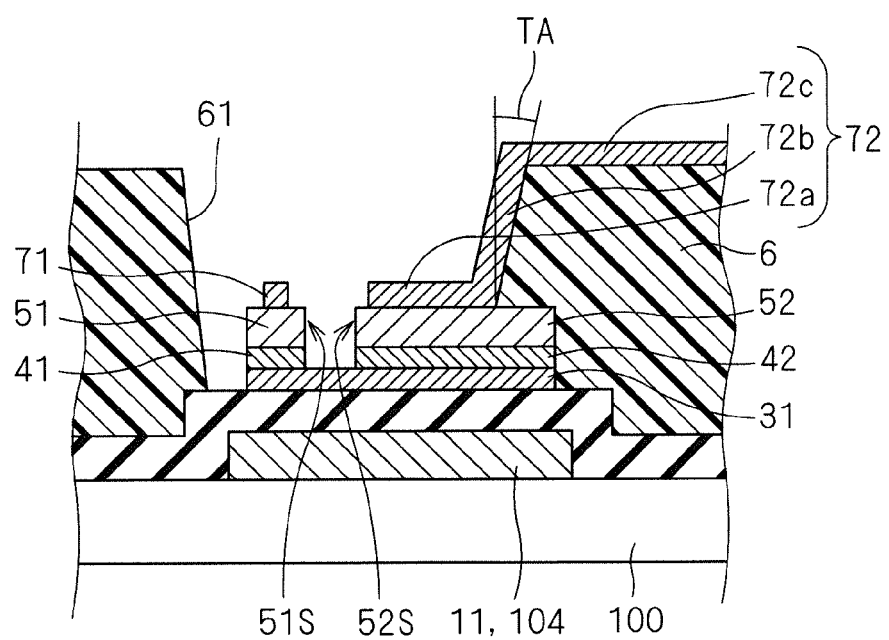

F I G. 2 2 A
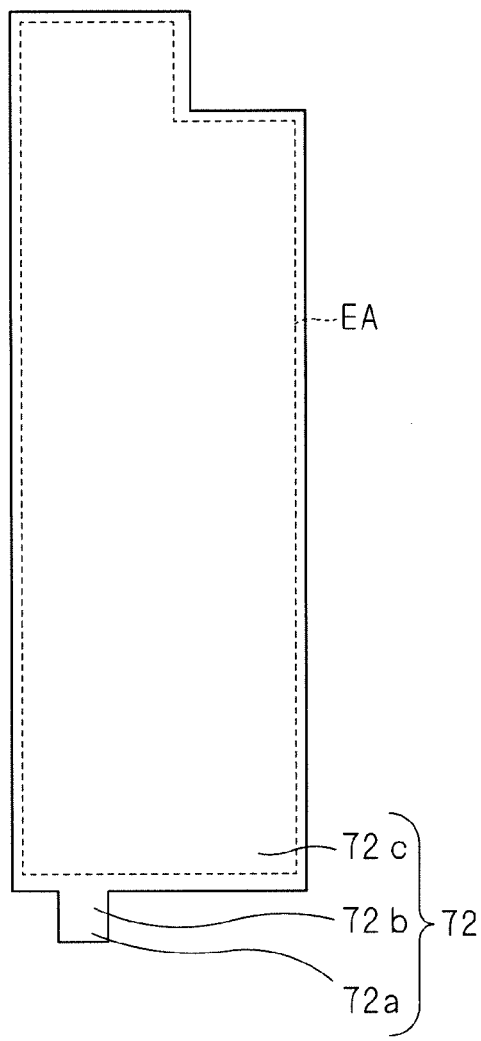
F I G. 2 2 B
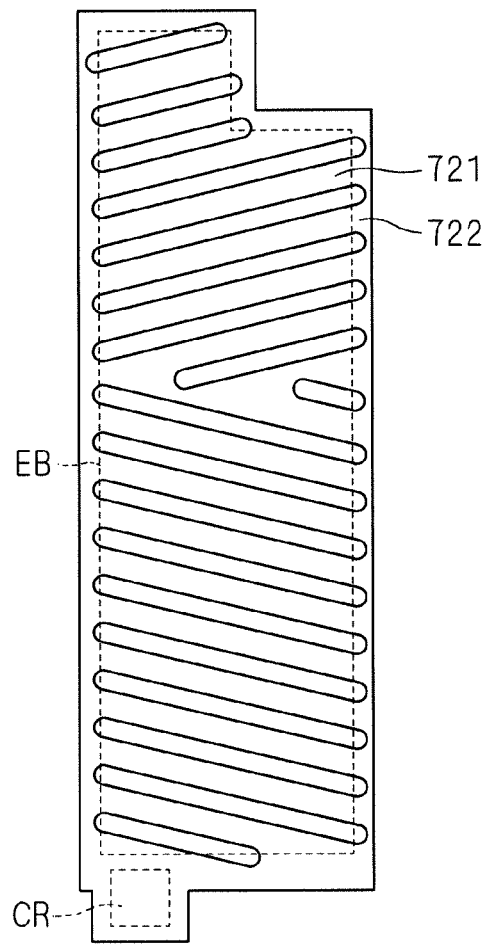

LIQUID CRYSTAL DISPLAY PANEL AND METHOD FOR MANUFACTURING LIQUID CRYSTAL DISPLAY PANEL

BACKGROUND OF THE INVENTION

Field of the Invention

The present invention relates to a liquid crystal display panel and a method for manufacturing liquid crystal display panel.

Description of the Background Art

As a displaying method for liquid crystal display panels, the twisted nematic (TN) mode is widely used. The TN mode is the vertical electric field mode in which liquid crystal molecules are driven by generating substantially perpendicular electric fields in the panels. Meanwhile, in recent years, the transverse electric field mode in which liquid crystal molecules are driven in the horizontal direction by generating substantially horizontal electric fields in the panels has also been used. The transverse electric field mode offers advantages such as wide viewing angle, higher resolution, and high luminance, thus becoming mainstream for small or middle-sized panels typified by smartphones and tablets. The typical example of the transverse electric field mode is the fringe field switching (FFS) mode.

When a voltage is applied between the pixel electrode and the counter electrode (common electrode) so that the transverse electric fields are generated, parasitic capacitance is generated between the signal line and one of the electrodes (lower electrode) that is located closer to the substrate. The large parasitic capacitance is likely to cause deterioration in display quality. To reduce the parasitic capacitance, the insulating film between the lower electrode and the signal line desirably has a large thickness and a small relative dielectric constant. In this respect, the insulating film is preferably an organic insulating film. The organic insulating film covers steps such as thin film transistors (TFTs), thus also being advantageous in terms of offering leveling properties. In a case where a material having photosensitivity is used as the organic insulating film, an opening (contact hole) can be directly formed therein by photolithography.

In Japanese Patent Application Laid-Open No. 2007-226175, the liquid crystal device to which the FFS is applied is disclosed. In one aspect described therein, the liquid crystal device includes relay electrodes extending into the contact holes in the insulating film made of $SiO_2$, namely, the inorganic insulating film. The TFTs and the pixel electrodes are electrically connected by the relay electrodes. In this technique, the structure and the manufacturing method are complicated because the relay electrodes are included. Thus, the direct connection between the pixel electrodes and the drain electrodes without using the relay electrodes is desired.

United States Patent Application Publication No. 2013/0063673 discloses that the organic insulating film having photosensitivity is included as the insulating film disposed on the TFTs. The organic insulating film has the openings through which the TFTs are exposed. The pixel electrodes are electrically connected to the TFTs through the openings. Specifically, the pixel electrodes are in direct contact with the side surfaces of the ohmic contact layer and the active layer and with the drain electrodes.

In United States Patent Application Publication No. 2013/0063673, the portion of the pixel electrode that is effective in terms of generating electric fields, that is, the portion opposed to the common electrode extends above the opening of the organic insulating film, on the gate insulating film, on the side surface of the active layer, and on the side wall of the ohmic contact layer, thereby being connected to the drain electrode of the TFT. The pixel electrode follows such a complicated path, so that the pixel electrode may be interrupted at some midpoint, particularly on boundaries between the layers, due to variations in the manufacturing processes. Therefore, the manufacturing yields can be reduced.

SUMMARY OF THE INVENTION

The present invention therefore has been made to solve the problems described above and an object thereof is to provide a liquid crystal display panel and a method for manufacturing liquid crystal display panel that are capable of improving manufacturing yields.

A liquid crystal panel according to the present invention includes an insulating substrate, a gate electrode, a gate insulating film, a semiconductor film, a signal line, a source electrode, a drain electrode, an organic insulating film, a pixel electrode, an interlayer insulating film, and a common electrode. The gate electrode is located on the insulating substrate. The gate insulating film covers the gate electrode above the insulating substrate. The semiconductor film is partially located on the gate insulating film and is opposed to the gate electrode via the gate insulating film. The signal line is located above the insulating substrate. The source electrode is partially located above the semiconductor film and is linked to the signal line. The drain electrode is located above the semiconductor film apart from the source electrode. The source electrode and the drain electrode have a source-electrode side surface and a drain-electrode side surface, respectively. The source-electrode side surface and the drain-electrode side surface are opposed to each other with a gap therebetween in an opposition direction above the semiconductor film. The organic insulating film covers the signal line above the insulating substrate. The organic insulating film has an opening through which the drain electrode is partially exposed. The opening has a side wall extending from above the drain electrode. The pixel electrode has a contact portion that is in contact with the drain electrode in the opening of the organic insulating film, a wiring portion that extends directly on the side wall of the organic insulating film from the contact portion, and a body portion that is linked to the wiring portion and is located on the organic insulating film. The pixel electrode is formed of a transparent conductor. The interlayer insulating film covers the pixel electrode. The interlayer insulating film covers the source electrode and directly covers the semiconductor film between the source-electrode side surface and the drain-electrode side surface. The common electrode is located on the interlayer insulating film and has fringes opposed to the pixel electrode via the interlayer insulating film.

A method for manufacturing liquid crystal display panel according to the present invention includes the following processes.

A gate electrode is formed on an insulating substrate.

A gate insulating film that covers the gate electrode above the insulating substrate is formed.

A semiconductor film, a signal line, and an electrode film are formed. The semiconductor film is partially located on the gate insulating film and is opposed to the gate electrode via the gate insulating film. The signal line is located above the insulating substrate. The electrode film is linked to the signal line and is located above the semiconductor film.

An organic insulating film that covers the signal line above the insulating substrate and has an opening through which the electrode film is partially exposed is formed. The opening has a side wall extending from above the electrode film.

A transparent conductive film that covers the organic insulating film and is in contact with the electrode film in the opening of the organic insulating film is formed.

On the transparent conductive film, a photoresist film including an opening pattern, a first photoresist pattern having a first thickness, and a second photoresist pattern that is thicker than the first thickness is formed.

A pixel electrode made of a transparent conductor is formed by patterning the transparent conductive film using the first and second photoresist patterns of the photoresist film as an etching mask. The pixel electrode has a contact portion that is in contact with the electrode film in the opening of the organic insulating film, a wiring portion that extends directly on the side wall of the organic insulating film from the contact portion, and a body portion that is linked to the wiring portion and is located on the organic insulating film.

The electrode film is patterned using the first and second photoresist patterns of the photoresist film as an etching mask. The patterning the electrode film includes forming, from the electrode film, a source electrode that is linked to the signal line and a drain electrode that is located apart from the source electrode and is in contact with the contact portion of the pixel electrode. The source electrode and the drain electrode have a source-electrode side surface and a drain-electrode side surface, respectively. The source-electrode side surface and the drain-electrode side surface are opposed to each other with a gap therebetween in an opposition direction above the semiconductor film.

The photoresist film is narrowed by removing the first photoresist pattern and leaving at least part of the second photoresist pattern in a planar layout.

The pixel electrode is patterned using the photoresist film after the photoresist film is narrowed.

An interlayer insulating film that covers the pixel electrode is formed. The interlayer insulating film covers the source electrode and directly covers the semiconductor film between the source-electrode side surface and the drain-electrode side surface.

A common electrode having fringes opposed to the pixel electrode via the interlayer insulating film is formed on the interlayer insulating film.

According to the present invention, the pixel electrode has the contact portion that is in contact with the drain electrode in the opening of the organic insulating film, the wiring portion that extends directly on the side wall of the organic insulating film from the contact portion, and the body portion that is linked to the wiring portion and is located on the organic insulating film. This configuration can prevent the pixel electrode from being interrupted at some midpoint due to variations in the manufacturing processes. Therefore, the manufacturing yields can be improved.

These and other objects, features, aspects and advantages of the present invention will become more apparent from the following detailed description of the present invention when taken in conjunction with the accompanying drawings.

BRIEF DESCRIPTION OF THE DRAWINGS

FIG. 2 is a plan view schematically showing a configuration of an array substrate included in the liquid crystal display panel in FIG. 1;

FIG. 5 is a schematic partial plan view from which illustrations of a pixel electrode and an organic insulating film in FIG. 4 are omitted;

FIGS. 8A and 8B are schematic cross-sectional views respectively taken along the line VIIIA-VIIIA and the line VIIIB-VIIIB in FIG. 7;

FIG. 20A is a partial cross-sectional view schematically showing positional relationships between a source electrode and a dummy electrode and between a drain electrode and a pixel electrode in a comparative example and FIG. 20B is a partial cross-sectional view schematically showing the positional relationships between the source electrode and the dummy electrode and between the drain electrode and the pixel electrode in the first preferred embodiment;

FIG. 21 is a partial cross-sectional view illustrating a taper angle in an opening of an organic insulating film;

FIG. 22A is a plan view schematically showing an effective region of the pixel electrode in the first preferred embodiment and FIG. 22B is a plan view schematically showing the effective region of the pixel electrode in a comparative example in which the pixel electrode is disposed as an upper electrode;

DESCRIPTION OF THE PREFERRED EMBODIMENTS

Figure 1:
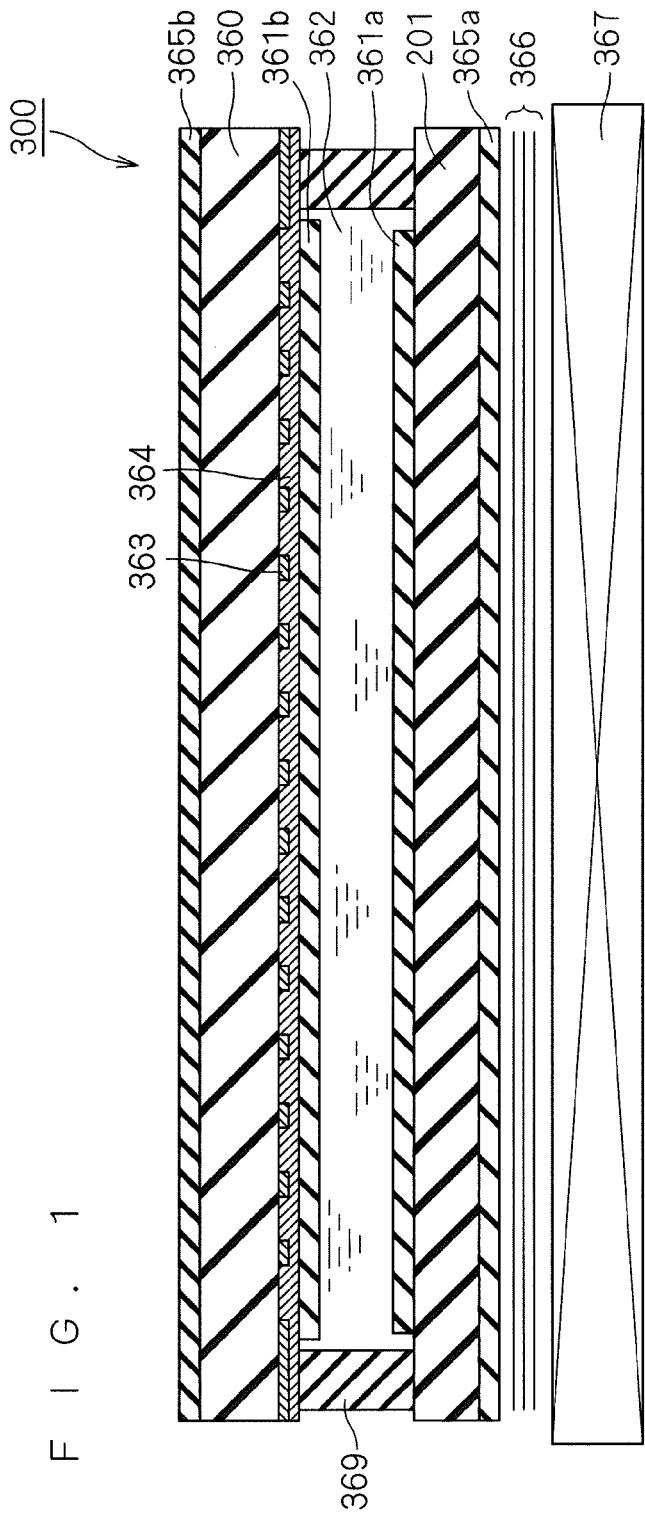
FIG. 1 is a cross-sectional view showing a configuration of a liquid crystal display panel according to a first preferred embodiment of the present invention.

Preferred embodiments of the present invention are described below with reference to the drawings. In the drawings below, the same or corresponding portions are given the same reference signs and the description thereof is not repeated. The drawings are shown schematically and do not correctly reflect the size and the like of the constituent elements shown in the drawings. To avoid the complication of the drawings, the portions other than the main portions of the present invention are omitted and part of the configuration of the present invention is simplified as appropriate.

First Preferred Embodiment

Overall Configuration

Figure 3:
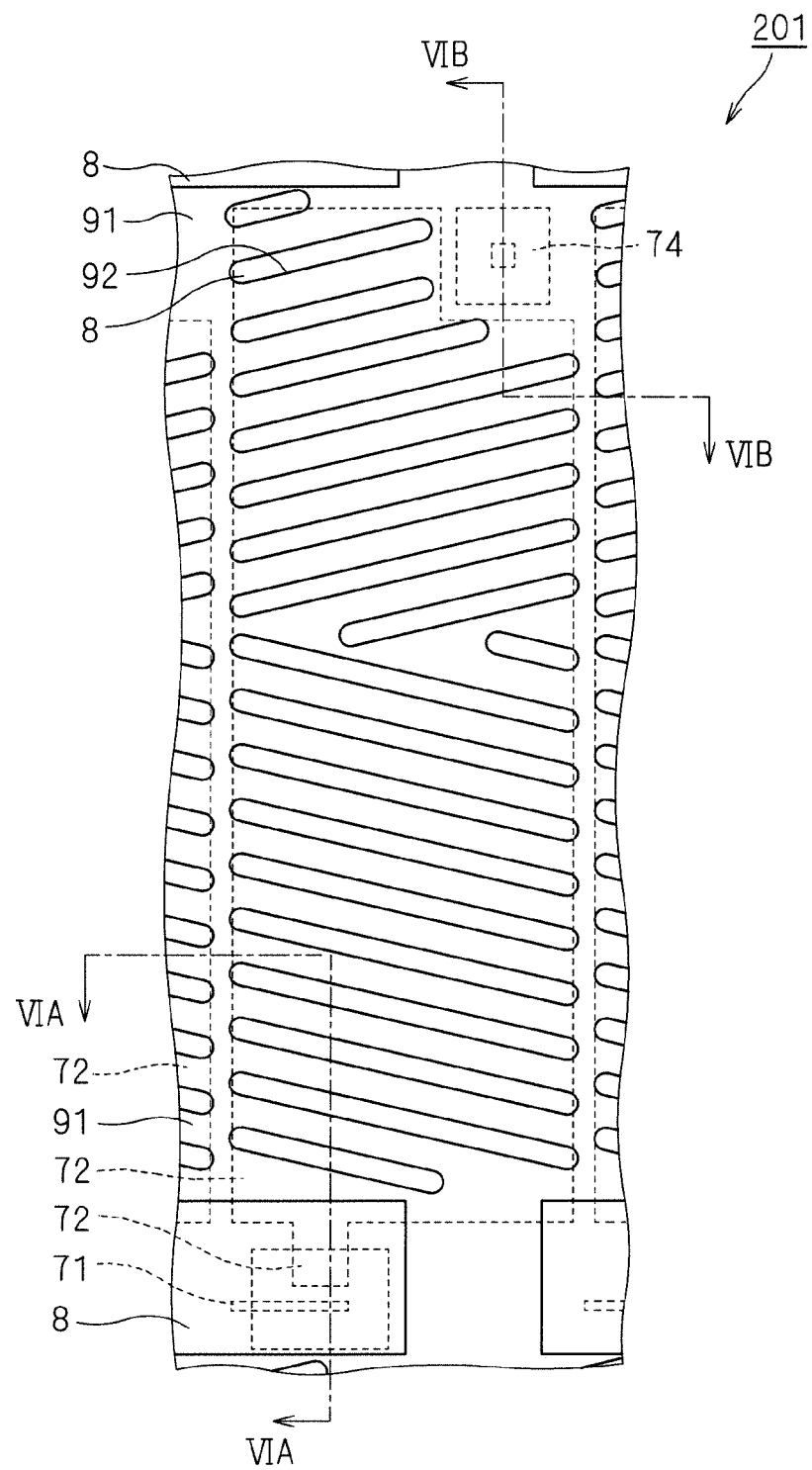
FIG. 3 is a partial plan view schematically showing a configuration of the vicinity of one pixel in the array substrate 1 in FIG. 2.
Figure 4:
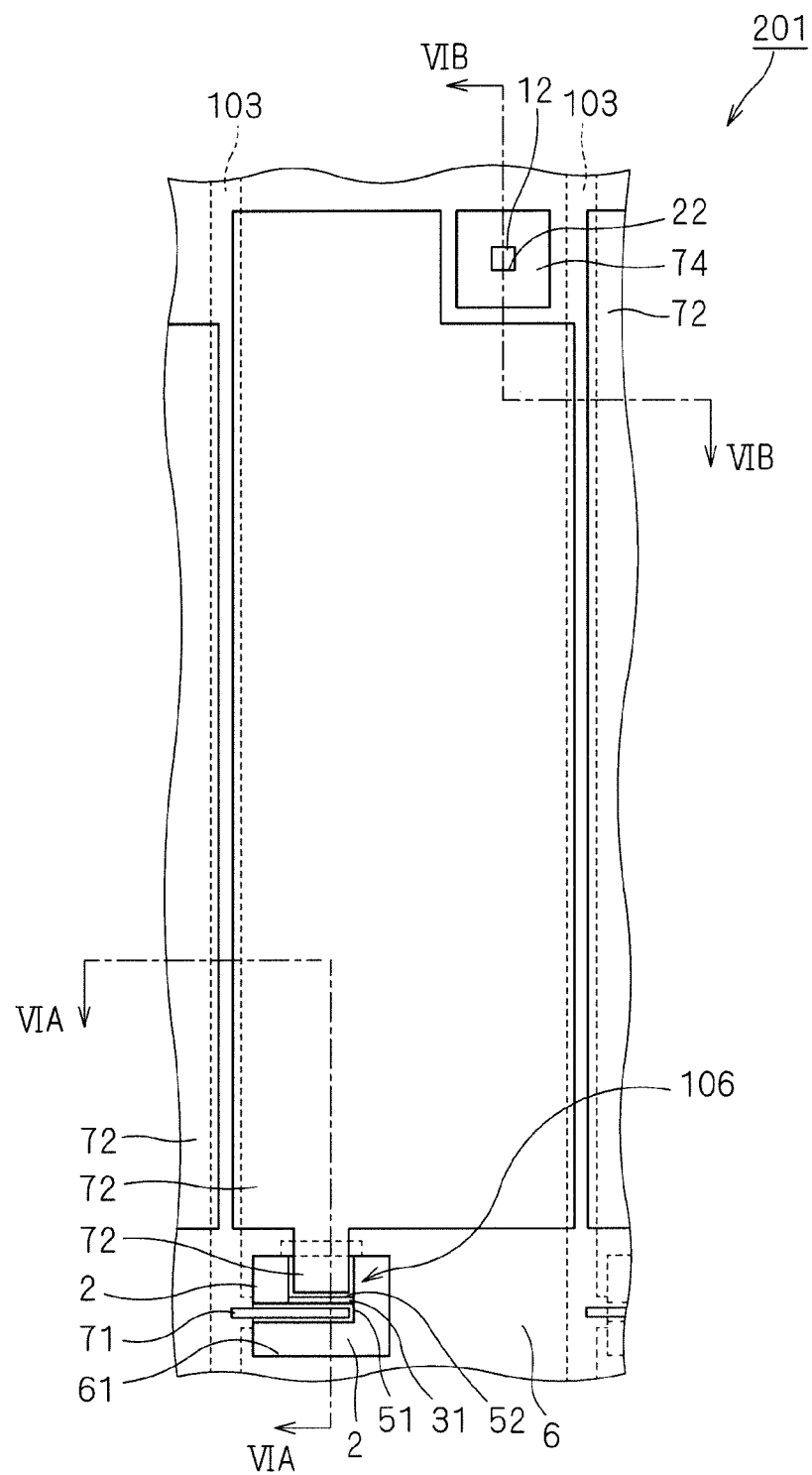
FIG. 4 is a schematic partial plan view from which illustrations of a common electrode and an interlayer insulating film in FIG. 3 are omitted.

Firstly, the outline of an overall configuration of a liquid crystal display panel in this preferred embodiment is described with reference to FIGS. 1 and 2. A configuration of an array substrate, which is the configuration particularly distinctive of this preferred embodiment, will be described below with reference to FIG. 3 and the following drawings.

Referring to FIG. 1, a liquid crystal display panel 300 according to this preferred embodiment includes, an array substrate 201, alignment films 361a and 361b, a liquid crystal layer 362, a counter substrate 360, a seal 369, polarizing plates 365a and 365b, optical films 366, and a backlight unit 367.

The alignment film 361a is located on common electrodes of the array substrate 201 that are described below. The liquid crystal layer 362 is located on the alignment film 361a. On the liquid crystal layer 362, the alignment film 361b is located. The alignment film 361b is located on the counter substrate 360. The counter substrate 360 having the alignment film 361b disposed thereon is opposed to the array substrate 201 with a gap therebetween. The counter substrate 360 is disposed on the view side. On the counter substrate 360, a color filter 364 and a black matrix 363 are located. In this configuration, the liquid crystal layer 362 is sandwiched between the array substrate 201 and the counter substrate 360.

Moreover, the polarizing plates 365a and 365b are located on the outer surfaces of the array substrate 201 and the counter substrate 360, respectively. The polarizing plates 365a and 365b are preferably disposed in the cross nicol arrangement. On the back surface side of the array substrate 201 that is the side of the liquid crystal display panel opposite to the view side, the backlight unit 367 is disposed via the optical films 366 such as phase difference plates. The liquid crystal display panel and these peripheral members may be housed in a frame (not shown) made of, for example, resin or metal.

The alignment direction of the liquid crystal layer 362 is adjusted by the array substrate 201, so that the polarizing state of the light passing through the liquid crystal layer 362 is controlled. Specifically, the light from the backlight unit 367 is linearly polarized by the polarizing plate 365 on the array-substrate-201 side. The linearly polarized light passes through the liquid crystal layer 362, whereby the polarization state is changed. Depending on the polarization state, the intensity of the light passing through the polarizing plate 365b on the counter-substrate-360 side changes. The alignment direction of the liquid crystal layer 362 changes according to the display voltage applied onto the array substrate 201. Therefore, the intensity of the light passing through the polarizing plate 365b can be changed by controlling the display voltage. The liquid crystal displaying is thus enabled.

With reference to FIG. 2, the array substrate 201 includes a display region 101 in which an image is displayed and a frame region 102 that surrounds the display region 101. In the frame region 102, external wires 107 extended from the display region 101 are connected to a plurality of terminal electrodes for external connection. The terminal electrodes are connected to printed board 108 and terminals on IC-chips-109 via an anisotropic conductive film (ACF) or bumps. In the display region 101, a plurality of signal lines 103 and a plurality of scanning lines 104 are disposed to be orthogonal to one another. A plurality of common wires 105 are disposed to be parallel to the scanning lines 104. A single pixel is defined by the adjacent signal lines 103 and the adjacent scanning lines 104. Thus, a matrix (an array) of a plurality of pixels is arranged. In each pixel, a TFT 106 including a source electrode connected to the signal line 103 and a gate electrode connected to the scanning line 104 is provided.

The TFTs 106 function as the switching elements that perform on-off control on the supply of display voltage. Specifically, when a signal is supplied from the scanning line 104, a current flows from the source-electrode side to the drain-electrode side of the TFT 106. Thus, the voltage based on the signal data supplied from the signal line 103 is applied onto the pixel-electrode side. The signal data is controlled by the printed board 108 or the IC chips 109, whereby the voltage corresponding to the display data from the outside is supplied to each pixel.

(Configuration of Array Substrate)

Next, a configuration of the vicinity of one pixel in the array substrate 201 included in the liquid crystal display panel 300 is described in detail.

With reference to FIGS. 3, 4, 5, 6A, and 6B, the array substrate 201 includes an insulating substrate 100, a gate electrode 11, a contact electrode 12, a gate insulating film 2, semiconductor films 3 and 31, a source electrode 51, a drain electrode 52, an organic insulating film 6, a dummy electrode 71, a pixel electrode 72, a conductive film 74, an interlayer insulating film 8, contact layers 4, 41, and 42, a common electrode 91, the signal line 103, the scanning line 104, and the common wire 105.

The insulating substrate 100 is light transmissive. The insulating substrate 100 is, for example, a glass substrate.

The gate electrode 11, the scanning line 104, the contact electrode 12, and the common wire 105 are located on the insulating substrate 100. In this preferred embodiment, these are made of the same metal. As the metal, aluminum (Al) or alloy including aluminum may be used or copper (Cu), molybdenum (Mo), or chromium (Cr) may be used. The gate electrodes 11 are provided correspondingly to the respective TFTs 106. As shown in FIG. 5, the gate electrode 11 and the scanning line 104 are integrally formed. Thus, the gate electrode 11 is connected to the scanning line 104. Similarly, the contact electrode 12 and the common wire 105 are integrally formed. Thus, the contact electrode 12 is connected to the common wire 105. The scanning line 104 and the common wire 105 are extended in parallel to each other.

The gate insulating film 2 covers the gate electrode 11, scanning line 104, and the common wire 105 on the insulating substrate 100. The insulating film 2 has an opening 22 through which the contact electrode 12 is exposed. The material for the gate insulating film 2 is, for example, silicon nitride.

The semiconductor film 31 is partially located on the gate insulating film 2 and is opposed to the gate electrode 11 via the gate insulating film 2. The semiconductor film 31 is, for example, a silicon semiconductor film that is one of an amorphous layer, a microcrystalline layer, and a polycrystalline layer, or a laminate of these layers or is an oxide semiconductor film. The signal line 103 is located above the insulating substrate 100. The gate insulating film 2 has the opening 22 through which the common wire 105 is exposed at a position that is apart from the pixel electrode 72 in plan view (see FIG. 4).

The source electrode 51 and the signal line 103 are integrally formed. Thus, the source electrode 51 is connected to the signal line 103. The source electrode 51 is partially located above the semiconductor film 31. The signal line 103 is located above the gate insulating film 2.

The drain electrode 52 is located above the semiconductor film 31 apart from the source electrode 51. The source electrode 51 and the drain electrode 52 have a source-electrode side surface 51S and the drain-electrode side surface 52S, respectively (see FIG. 20B). The source-electrode side surface 51S and a drain-electrode side surface 52S are opposed to each other with a gap therebetween in an opposition direction (in the horizontal direction in FIG. 6A) above the semiconductor film 31.

The source electrode 51, the drain electrode 52, and the signal line 103 have the similar material composition. Each of the source electrode 51, the drain electrode 52, and the signal line 103 is not necessarily formed of a single layer and may be a laminated film made of different materials.

The contact layers 41 and 42 are located between the semiconductor film 31 and the source electrode 51 and between the semiconductor film 31 and the drain electrode 52, respectively. The contact layer 4 and the semiconductor film 3 are located between the signal line 103 and the gate insulating film 2. The contact layer 4 is made of the same material as those of the contact layers 41 and 42 and is made of, for example, a semiconductor having conductive impurities added thereto. The semiconductor film 3 is made of the same material as that of the semiconductor film 31.

The gate insulating film 2, the gate electrode 11, the semiconductor film 31, the contact layers 41 and 42, the source electrode 51, and the drain electrode 52 that are described above constitute the TFT 106 (FIG. 2). The TFT 106 has the configuration in which the gate electrode 11 is located between the insulating substrate 100 and the semiconductor film 31. That is, the TFT 106 is an inverted staggered TFT including a back channel.

The organic insulating film 6 covers, above the insulating substrate 100, the signal line 103 and part of the TFT 106. The organic insulating film 6 has the functions of leveling the surface by serving as such a covering and of ensuring the electrical insulation. The organic insulating film 6 has a thickness of, for example, about 2 to 4 μm. The organic insulating film 6 is preferably made of a resin having photosensitivity because a desired pattern can be obtained directly by photolithography without requiring etching. The display quality may be adversely affected by the noise transmitted from the signal line 103 to the pixel electrode 72. To suppress the noise, the organic insulating film 6 preferably has a low dielectric constant. Therefore, as the organic insulating film 6, the material having a dielectric constant lower than the dielectric constant of the gate insulating film 2 is preferably selected, and thus, for example, the organic resin consisting principally of acrylic resin is used. The acrylic resin has a dielectric constant ($\in$=about 3 to 4) lower than that of the silicon nitride film ($\in$=6 to 7), thus reducing the parasitic capacitance between the pixel electrode 72 and the signal line 103. This enables the above-mentioned noise to be suppressed.

Figure 6A:
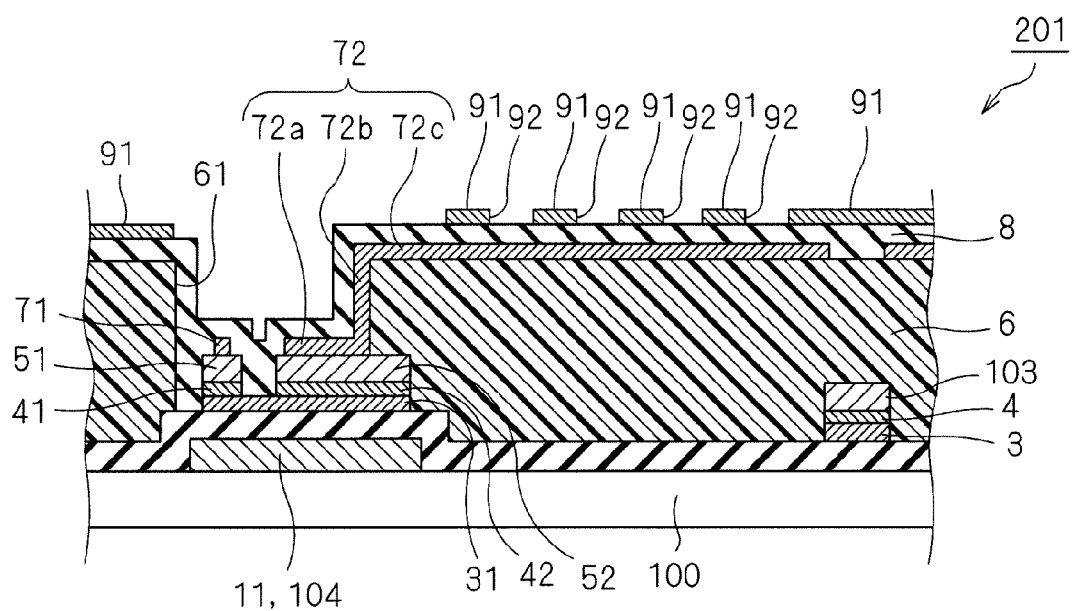
FIGS. 6A and 6B are schematic cross-sectional views respectively taken along the line VIA-VIA and the line VIB-VIB shown in each of FIGS. 3, 4, and 5.

The organic insulating film 6 has openings 61 and 62. The drain electrode 52 is partially exposed through the opening 61. The opening 61 has a side wall extending from above the drain electrode 52. Although FIG. 6A shows the opening 61 extending in the penetration direction (in the lengthwise direction of the drawing), the opening 61 preferably has a shape tapering toward the insulating substrate 100 as described in detail below (see FIG. 21). The side wall of the opening 61 has a side that bridges over the drain electrode 52 (the upper side in FIG. 4) and a side that bridges over the source electrode 51 (the left side of in FIG. 4). The opening 22 of the gate insulating film 2 is exposed through the opening 62, whereby the contact electrode 12 is exposed through the opening 62.

The pixel electrode 72 has a contact portion 72a that is in contact with the drain electrode 52 in the opening 61 of the organic insulating film 6, a wiring portion 72b that extends directly on the side wall of the organic insulating film 6 from the contact portion 72a, and a body portion 72c that is linked to the wiring portion 72b and is located on the organic insulating film 6. The wiring portion 72b is the portion of the pixel electrode 72 that climbs over the side wall of the opening 61 of the organic insulating film 6. The pixel electrode 72 is made of a transparent conductor and is made of, for example, indium zinc oxide (IZO) or indium tin oxide (ITO). The pixel electrode 72 has a pixel-electrode end part (the left-end part of the contact portion 72a in FIG. 6A) as the end part in the above-mentioned opposition direction in the opening 61 of the organic insulating film 6. The pixel-electrode end part is positioned inside the drain-electrode side surface 52S (FIG. 20B) on the drain electrode 52. Therefore, the drain electrode 52 and the pixel electrode 72 form a step part (see FIG. 20B).

The dummy electrode 71 is located on the source electrode 51 and is made of the same material as that of the pixel electrode 72. The dummy electrode 71 has a dummy-electrode end part (the right-end part of the dummy electrode 71 in FIG. 6A) that is opposed to the above-mentioned pixel-electrode end part in the opening 61 of the organic insulating film 6. The dummy-electrode end part is positioned inside the source-electrode side surface 51S (FIG. 20B) on the source electrode 51. Therefore, the source electrode 51 and the dummy electrode 71 form a step part.

The interlayer insulating film 8 covers the pixel electrode 72 and the organic insulating film 6. Moreover, the interlayer insulating film 8 covers the source electrode 51 and directly covers the semiconductor film 31 between the source-electrode side surface 51S and the drain-electrode side surface 52S (FIG. 20B). Furthermore, the interlayer insulating film 8 directly covers the above-mentioned step part formed by the drain electrode 52 and the pixel electrode 72 and the above-mentioned step part formed by the source electrode 51 and the dummy electrode 71. The interlayer insulating film 8 has an opening 82 through which the opening 62 of the organic insulating film 6 is exposed. The interlayer insulating film 8 is made of, for example, silicon nitride or silicon oxide. The voltage for generating fringe fields is applied onto the interlayer insulating film 8. The voltage is, for example, about 6 to 7 V. In this case, the interlayer insulating film 8 preferably has a thickness of about 200 to 400 nm. When the interlayer insulating film 8 is formed thinner, the power consumption can be reduced. However, the interlayer insulating film 8 that is excessively thin does not function adequately as the protective film for shielding the TFT 106 from moisture or the like in the opening 61.

The common electrode 91 is disposed on the interlayer insulating film 8. The common electrode 91 has slits 92 that are opposed to the pixel electrode 72 via the interlayer insulating film 8. Thus, the common electrode 91 has fringes that are opposed to the pixel electrode 72 via the interlayer insulating film 8. The fringes are provided, so that the fringe fields required for liquid crystal driving in the FFS mode can be generated.

The conductive film 74 is located along the side wall of the opening 62 of the organic insulating film 6. The conductive film 74 is made of the same material as that of the pixel electrode 72. The common electrode 91 is in contact with the contact electrode 12 through the opening 82 of the interlayer insulating film 8, the opening 62 covered by the conductive film 74, and the opening 22 of the gate insulating film 2. Therefore, the common electrode 91 and the common wire 105 are electrically connected to each other.

When a voltage is applied between the pixel electrode 72 and the common electrode 91, electric fields are generated between the pixel electrode 72 and the common electrode 91. Part of the electric fields passes through the slits 92 in the common electrode 91 toward the upper part in FIGS. 6A and 6B. The liquid crystal molecules in the liquid crystal layer 362 (FIG. 1) are driven by the electric fields.

On the common electrode 91, the alignment film 361a (FIG. 1) is located. The alignment film 361a is made of polyimide and is a thin film which has been rubbed. The surface on which the alignment film 361a is formed is desirably as level as possible at least on the region in which the body part 72c of the pixel electrode 72 and the common electrode 91 are opposed to each other. The organic insulating film 6 contributes to the leveling. Moreover, the thickness of the common electrode 91 is reduced as much as possible, which can also contribute to the leveling.

(Manufacturing Method)

Next, a method for manufacturing the array substrate 201 is described. The display region 101, and the external wires 107 and the terminal electrodes in the frame region 102 that are shown in FIG. 2 can be formed simultaneously. However, to simplify the explanation, one pixel part in the display region 101 is described with reference to the drawings. FIGS. 7, 9, 11, 13, 15, and 17 show plan views in the visual field similar to that of FIG. 3 in the order of process. FIGS. 8A, 10A, 12A, 14A, 16A, 18A show cross-sectional views in the visual field similar to that of FIG. 6A in the order of process. FIGS. 8B, 10B, 12B, 14B, 16B, and 18B show cross-sectional views in the visual field similar to that of FIG. 6B in the order of process. Although FIGS. 13, 15, and 19 are plan views, they are hatched to make the drawings clearer.

Figure 7:
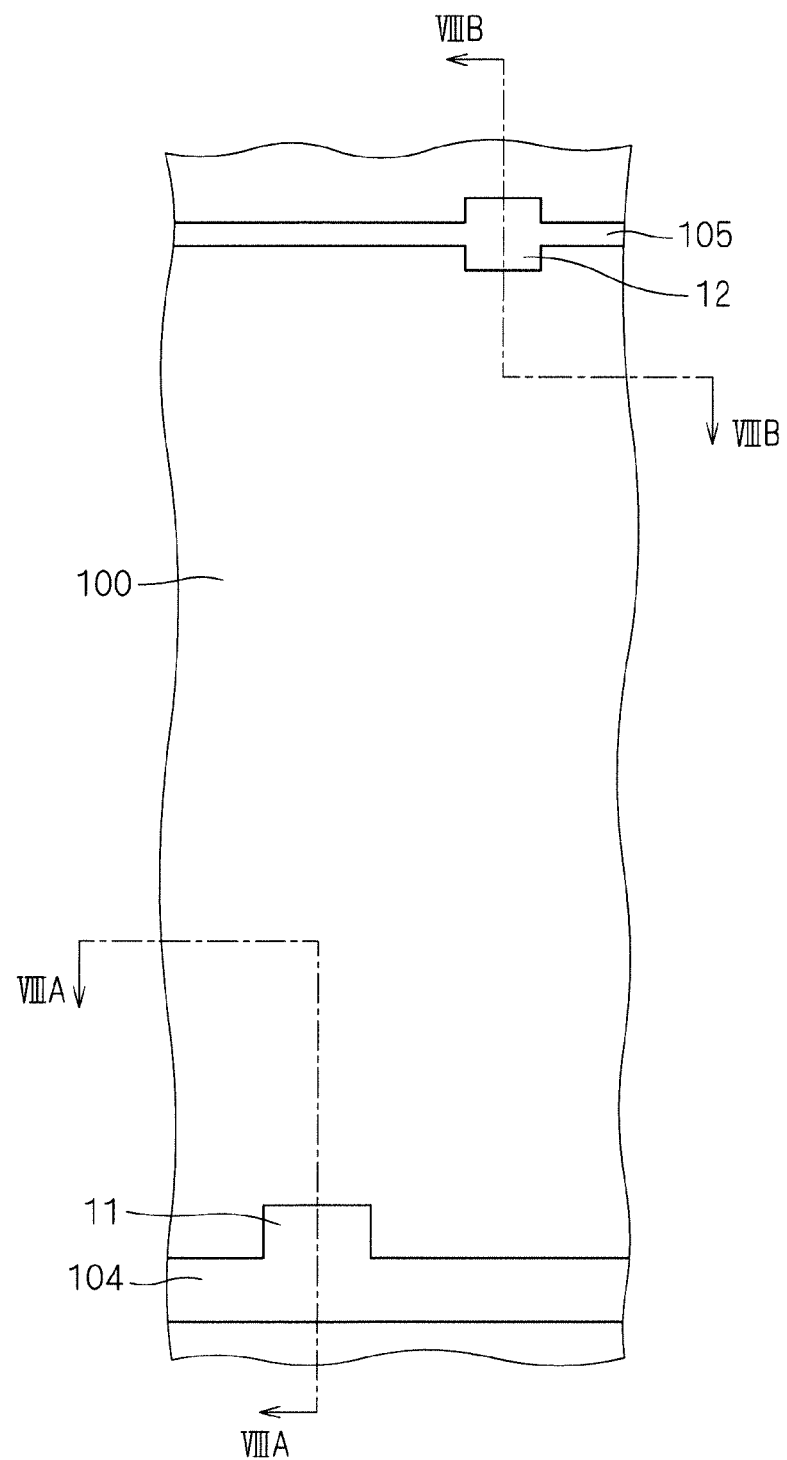
FIG. 7 is a partial plan view schematically showing a first process of a method for manufacturing the array substrate included in the liquid crystal panel according to the first preferred embodiment of the present invention.

With reference to FIGS. 7, 8A, and 8B, a metal film is formed on the insulating substrate 100 by, for example, sputtering. As the metal film, aluminum or an alloy including aluminum may be used or copper, molybdenum, chromium, or the like may be used. Then, a photoresist that is a photosensitive resin is applied onto the metal film by, for example, spin coating and a first photolithography process for exposing and developing the applied resist is performed. The photoresist is thus patterned into a desired shape. Then, the metal film is patterned into a desired shape by etching using the photoresist pattern as a mask. After that, the photoresist pattern is removed. Thus, the gate electrode 11, the scanning line 104, the contact electrode 12, and the common wire 105 are formed on the insulating substrate 100.

Figure 9:
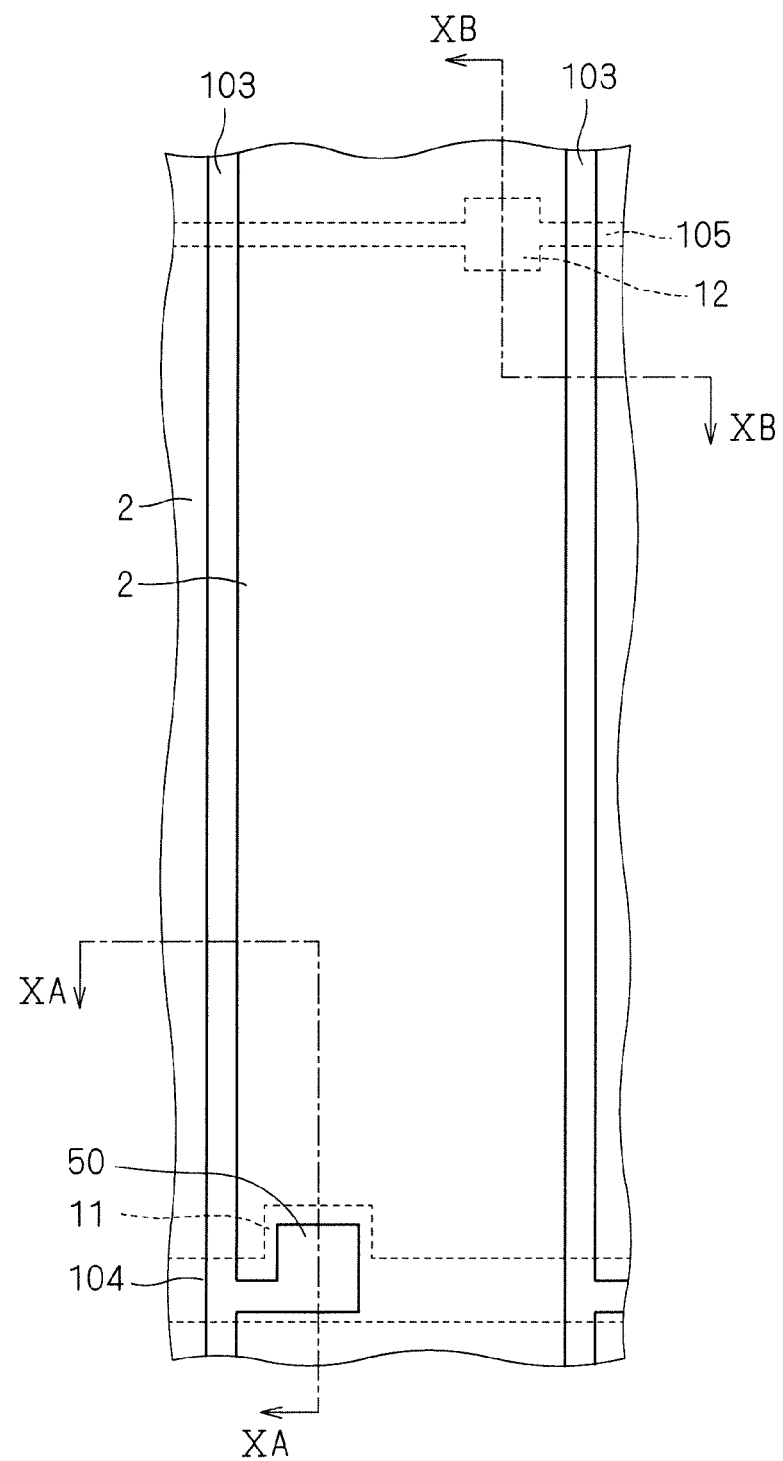
FIG. 9 is a partial plan view schematically showing a second process of the method for manufacturing the array substrate included in the liquid crystal panel according to the first preferred embodiment of the present invention.
Figure 10A:
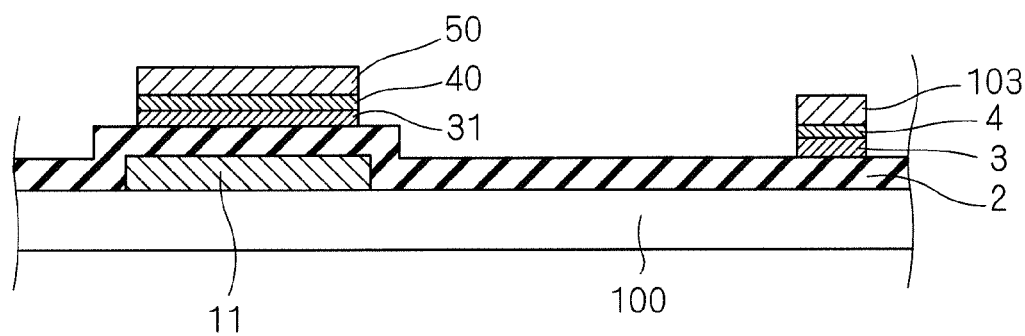
FIGS. 10A and 10B are schematic cross-sectional views respectively taken along the line XA-XA and the line XB-XB in FIG. 9.
Figure 10B:
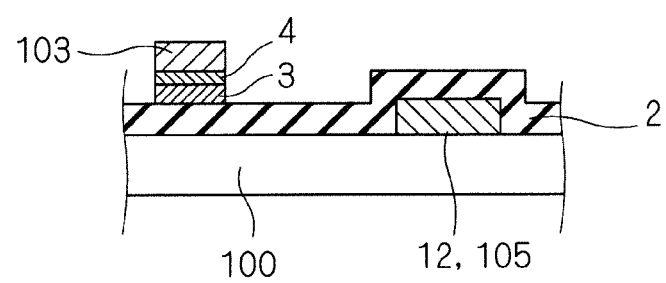

With reference to FIGS. 9, 10A, and 10B, the gate insulating film 2 that covers the gate electrode 11, the scanning line 104, the contact electrode 12, and the common wire 105 on the insulating substrate 100 are formed. For example, a silicon nitride film is formed by plasma chemical vapor deposition (CVD).

Next, the semiconductor film 3, the contact layer 4, and an electrode film 50 are formed. The semiconductor film 3 and the contract layer 4 are formed by, for example, plasma CVD. The contact layer 4 is made of a semiconductor having conductive impurities added thereto. The electrode film 50 is formed by, for example, sputtering. As the electrode film 50, aluminum or an alloy including aluminum may be used or copper, molybdenum, or chromium may be used.

Then, a photoresist pattern is formed by a second photolithography process and etching is performed using the photoresist pattern as a mask. Thus, the semiconductor film 3, the contact layer 4, and the electrode film 50 are patterned into the same shape. Specifically, the semiconductor film 31 is formed from the semiconductor film 3. The semiconductor film 31 is partially provided on the gate insulating film 2 and is opposed to the gate electrode 11 via the gate insulating film 2. The semiconductor film 3 remains below the signal line 103. A contact layer 40 is formed from the above-mentioned contact layer 4. The contact layer 4 remains below the signal line 103. From the electrode film 50 that has been formed (before being patterned), the signal line 103 that is provided above the insulating substrate 100 via the gate insulating film 2, the semiconductor film 3, and the contact layer 4 and the electrode film 50 that is provided above the semiconductor film 31 via the contact layer 40 and linked to the signal line 103 are formed. The contact layer 40 and the electrode film 50 each have a single pattern that includes the source electrode 51 and the drain electrode 52 (FIG. 5).

Figure 11:
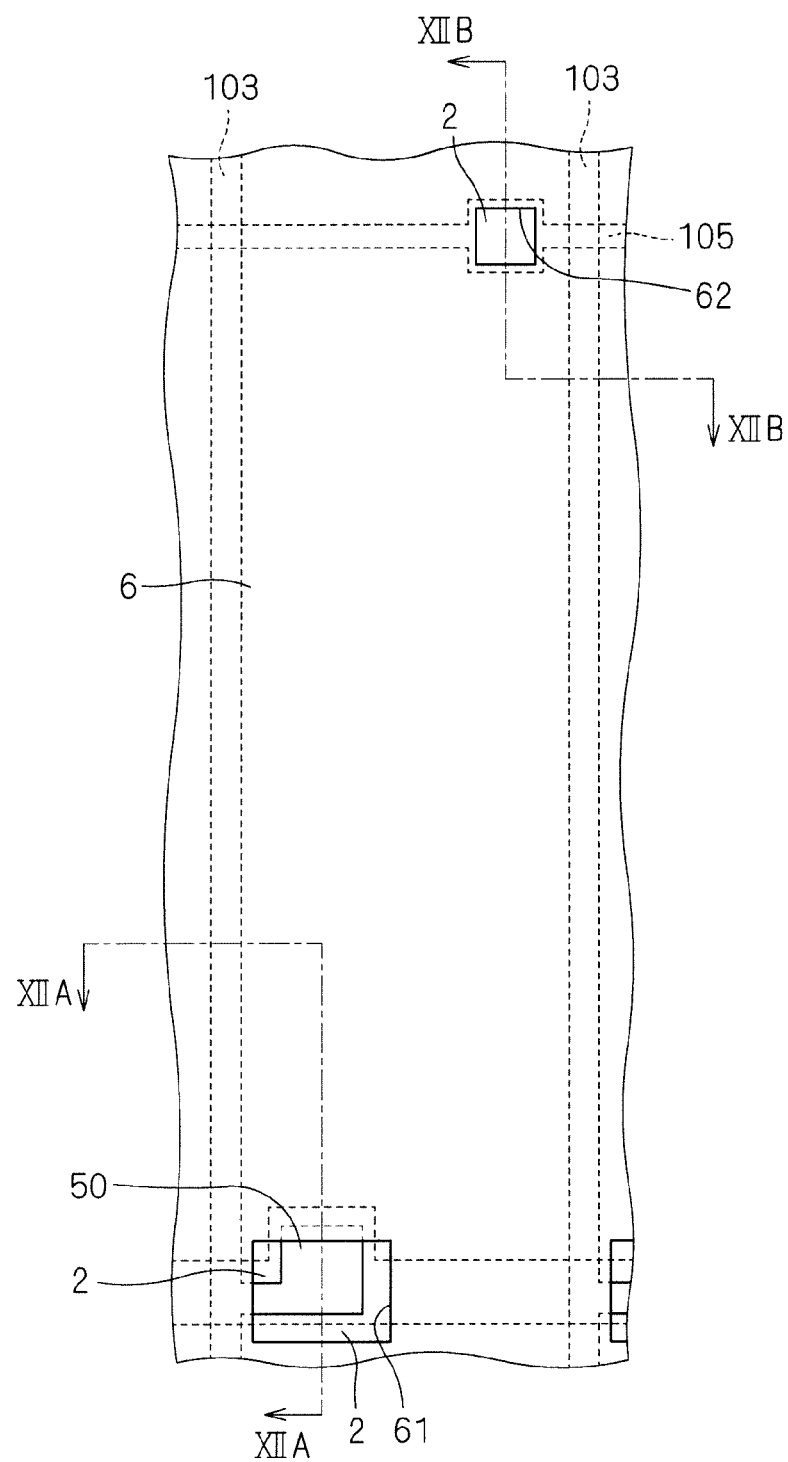
FIG. 11 is a partial plan view schematically showing a third process of the method for manufacturing the array substrate included in the liquid crystal panel according to the first preferred embodiment of the present invention.
Figure 12A:
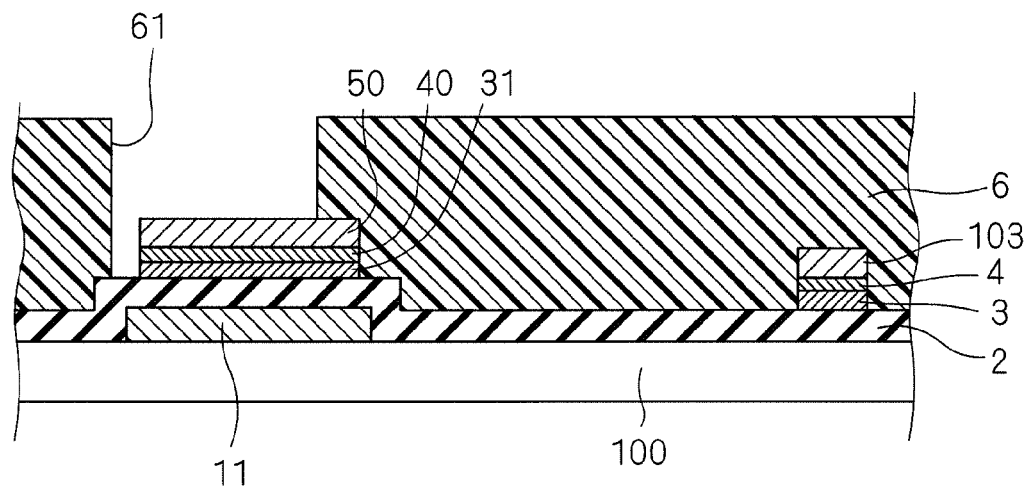
FIGS. 12A and 12B are schematic cross-sectional views respectively taken along the line XIIA-XIIA and the line XIIB-XIIB in FIG. 11.
Figure 12B:
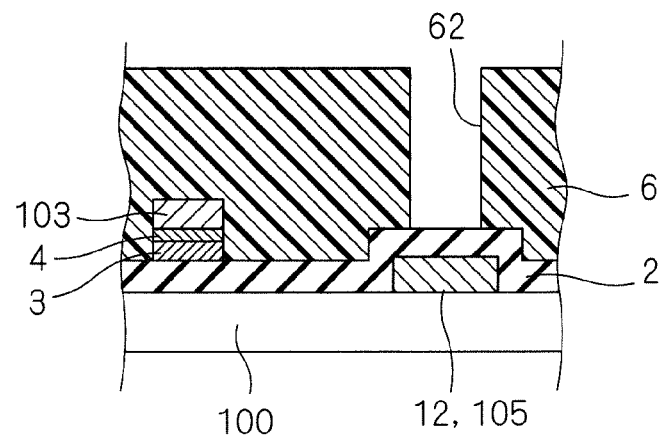
Figure 13:
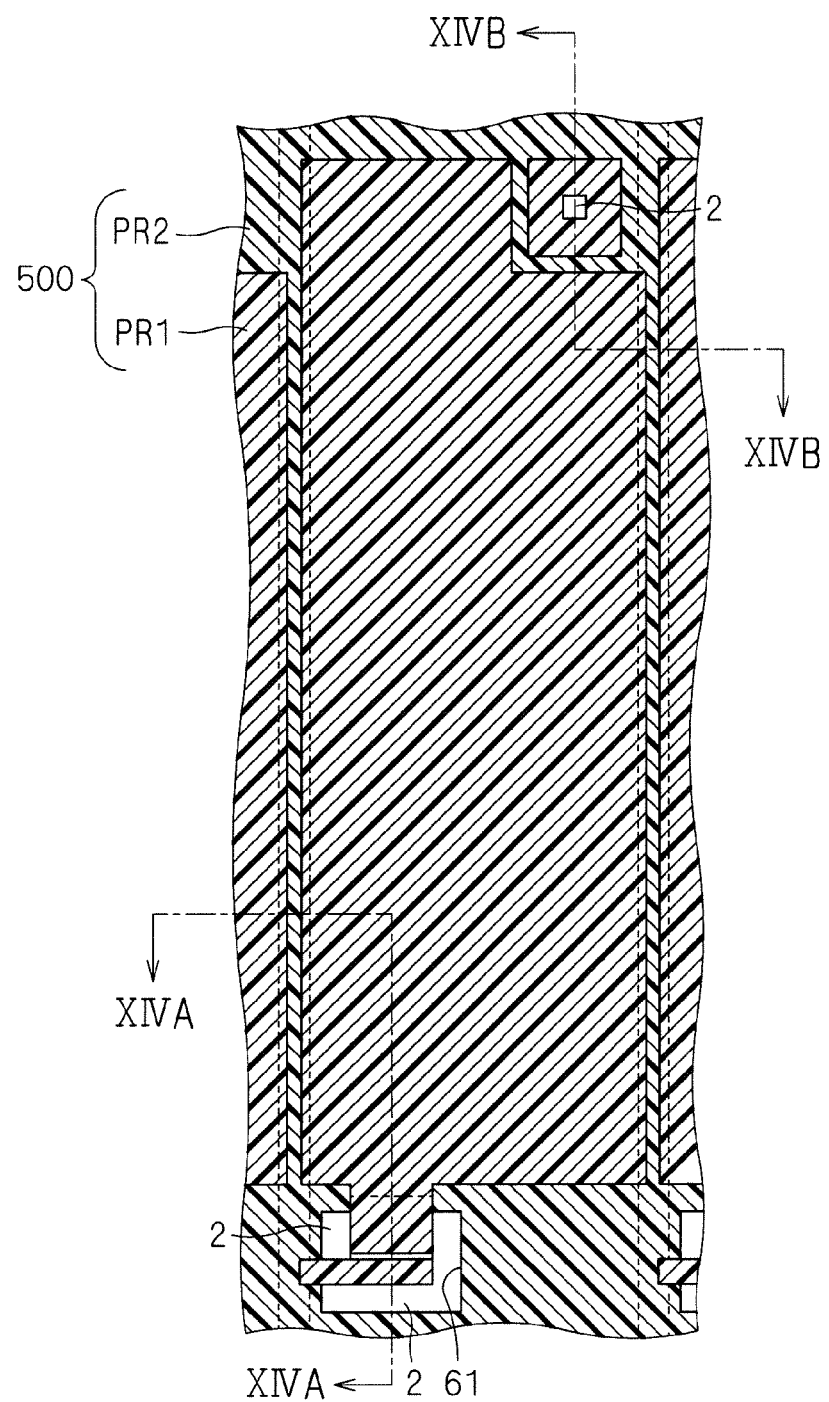
FIG. 13 is a partial plan view schematically showing a fourth process of the method for manufacturing the array substrate included in the liquid crystal panel according to the first preferred embodiment of the present invention.

With reference to FIGS. 11, 12A, and 12B, the organic insulating film 6 having photosensitivity is firstly coated by, for example, spin coating. By using the coating method, the organic insulating film 6 is formed to have a flat and smooth surface. The organic insulating film 6 covers the signal line 103 above the insulating substrate 100. Then, the organic insulating film 6 is exposed and developed in a third photolithography process, whereby the openings 61 and 62 are formed. The electrode film 50 is partially exposed through the opening 61. The opening 61 has the side wall extending from above the electrode film 50.

Then, the organic insulating film 6 is baked at around 230° C. A taper angle TA (FIG. 21) of about 40 to 60° is formed in each of the openings 61 and 62.

Figure 14A:
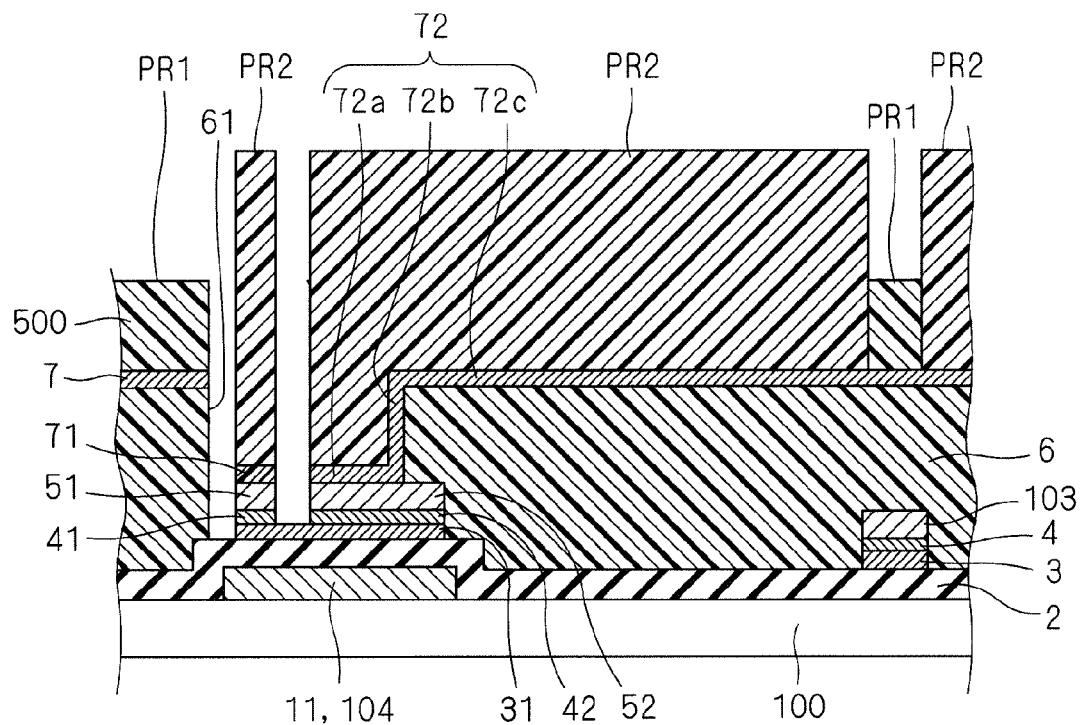
FIGS. 14A and 14B are schematic cross-sectional views respectively taken along the line XIVA-XIVA and the line XIVB-XIVB in FIG. 13.
Figure 14B:
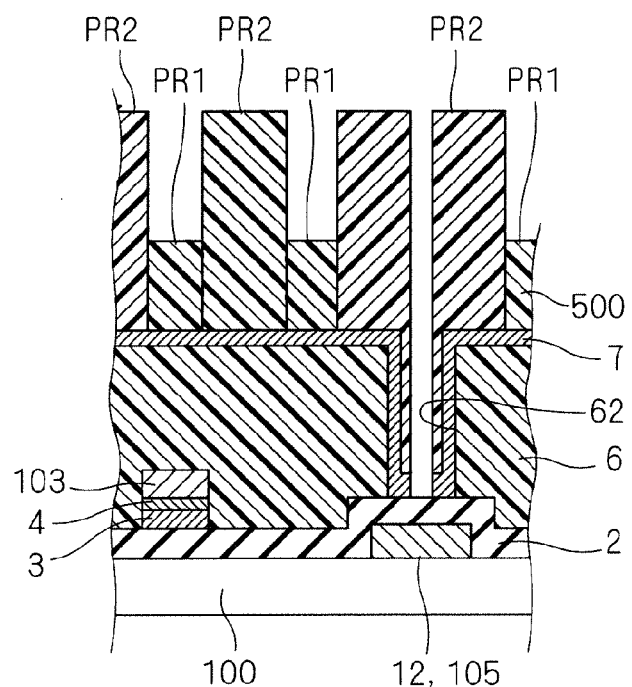
Figure 15:
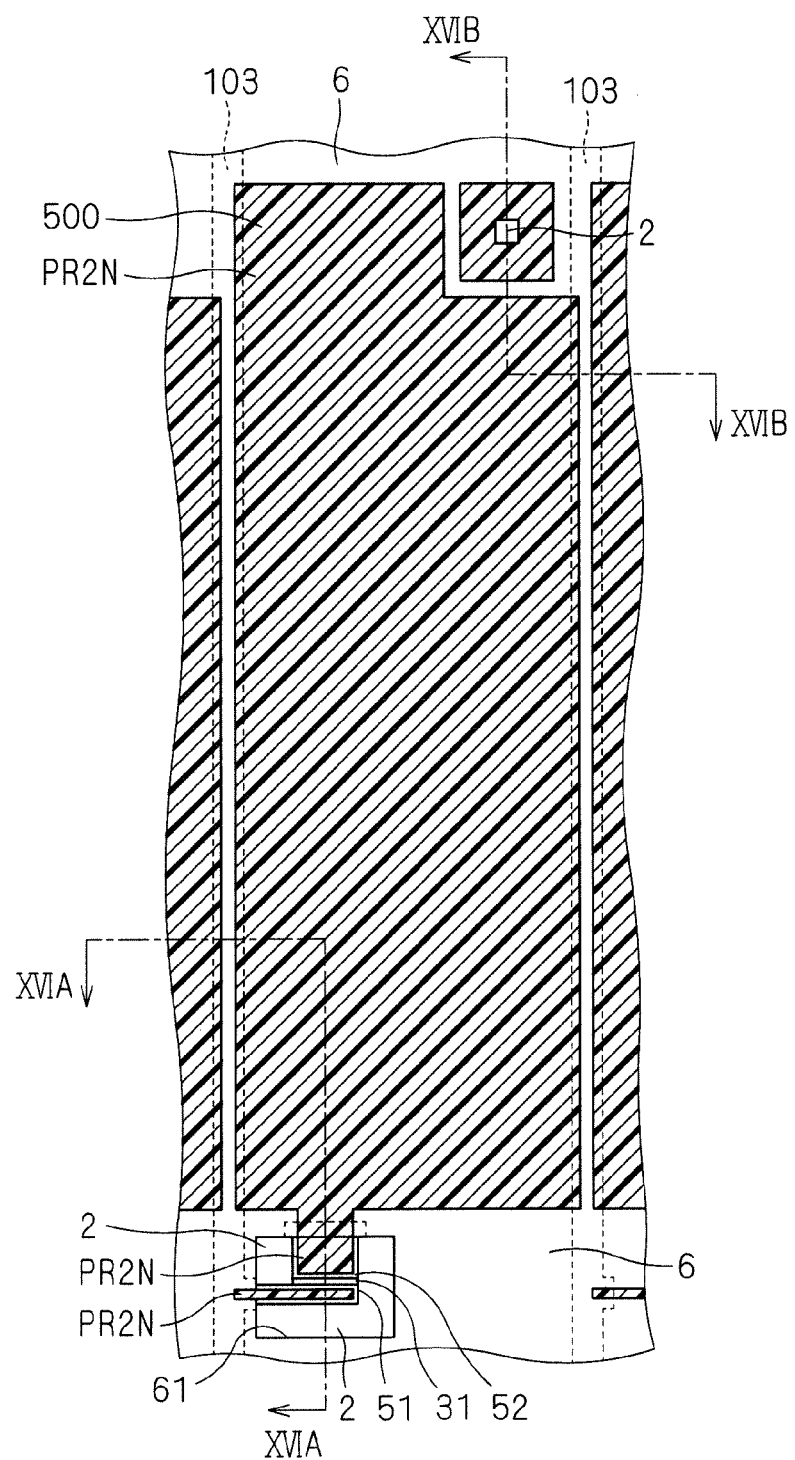
FIG. 15 is a partial plan view schematically showing a fifth process of the method for manufacturing the array substrate included in the liquid crystal panel according to the first preferred embodiment of the present invention.

With reference to FIGS. 13, 14A, and 14B, a transparent conductive film 7 is firstly formed by sputtering. The transparent conductive film 7 includes the portion that is to become the above-mentioned pixel electrode 72. That is, the transparent conductive film 7 covers the organic insulating film 6 and is in contact with the electrode film 50 in the opening 61 of the organic insulating film 6. Then, the transparent conductive film 7 is patterned as described below.

By a fourth photolithography process, a photoresist film 500 is formed on the transparent conductive film 7. The photoresist film 500 includes a photoresist pattern PR1 (first photoresist pattern) having a first thickness and a photoresist pattern PR2 (second photoresist pattern) that is thicker than the first thickness, and an opening pattern. In this process, the photoresist patterns PR1 and PR2 are respectively formed in a portion of the transparent conductive film 7 that is located on the organic insulating film 6.

A multi-tone mask 900 (FIG. 19) is prepared as a photomask to form the photoresist pattern having difference in level as described above. The photoresist film 500 is exposed using the multi-tone mask 900, whereby the thicknesses of the residual photoresist film 500 can be made different at different positions. The multi-tone mask 900 has a light-shielding region M1 (a first mask pattern that has a first transmittance), a semi-transmissive region M2 (a second mask pattern that has a second transmittance higher than the first transmittance), and a transmissive region M3 (a third mask pattern that has a third transmittance higher the second transmittance). The positive resist is exposed using the multi-tone mask 900, to thereby form an opening corresponding to the transmissive region M3, a pattern corresponding to the semi-transmissive region M2, and a thicker pattern corresponding to the light-shielding region M1. The semi-transmissive region M2 is preferably projected onto only a portion of the photoresist film 500 that is positioned outside the opening 61 of the organic insulating film 6.

Next, the transparent conductive film 7 is patterned using the photoresist patterns PR1 and PR2 of the photoresist film 500 as an etching mask. Consequently, the pixel electrode 72 is formed. By the etching using the photoresist patterns PR1 and PR2 as an etching mask, the electrode film 50 and the contact layer 40 (FIG. 12A) are patterned. Consequently, the source electrode 51 and the drain electrode 52 that are separated from each other are formed from the electrode film 50. Moreover, the contact layers 41 and 42 that are separated from each other are formed from the contact layer 40. Upon etching, a slight over-etching of the surface of the semiconductor film 31 may be tolerated.

In these processes, the inverted staggered TFT 106 including the back channel is formed in the opening 61 of the organic insulating film 6. An opening in the transparent conductive film 7 is formed in the opening 62 of the organic insulating film 6.

Next, the photoresist pattern PR1 is removed and at least part of the photoresist pattern PR2 in a planar layout is left, so that the photoresist film 500 is narrowed. In this preferred embodiment, the photoresist pattern PR2 in itself is also narrowed in a planar layout. That is, the photoresist pattern PR1 is removed, and in addition, the photoresist pattern PR2 is narrowed. The narrowing is carried out in the ashing process. By the ashing, the photoresist pattern PR1 is removed, and not only that, the photoresist pattern PR2 is set back. The ashing process can be continuously performed with the dry etching described above.

Figure 16A:
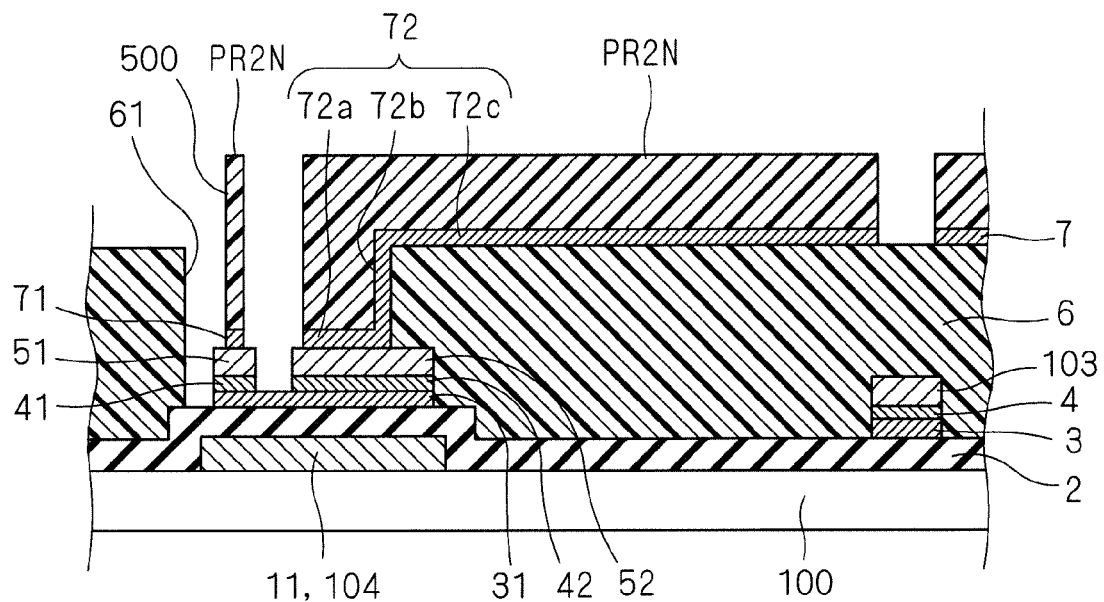
FIGS. 16A and 16B are schematic cross-sectional views respectively taken along the line XVIA-XVIA and the line XVIB-XVIB in FIG. 15.
Figure 16B:
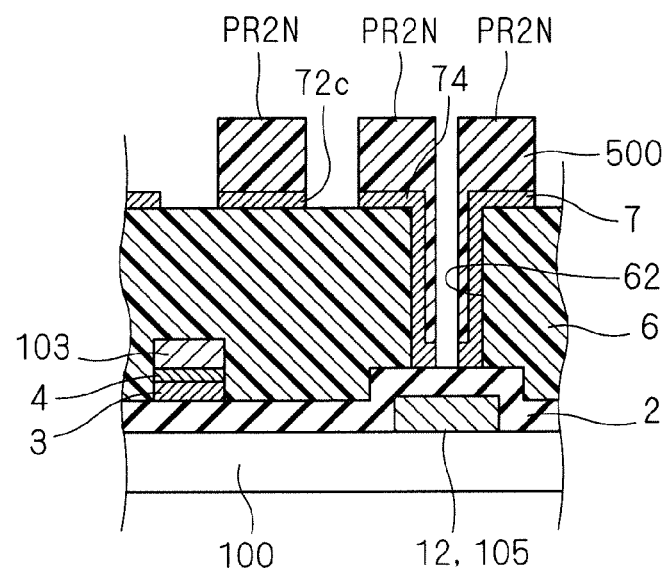

With reference to FIGS. 15, 16A, and 16B, in consequence of the above-described narrowing, the photoresist film 500 includes a photoresist pattern PR2N, which is the above-mentioned photoresist pattern PR2 that has been narrowed. The pixel electrode 72 is patterned using the photoresist film 500 having the photoresist pattern PR2N. The pixel electrodes 72 that are adjacent to each other are separated by the patterning as shown at the upper right of the FIG. 16A. The pattern of the dummy electrode 71 and the pattern of the contact portion 72a of the pixel electrode 72 are respectively adjusted such that the periphery of each pattern is set back (see FIGS. 14A and 16A). Out of the transparent conductive film 7, the conductive film 74 (FIG. 16B) is selectively left in this patterning. Then, the photoresist film 500 is peeled to be removed.

Figure 17:
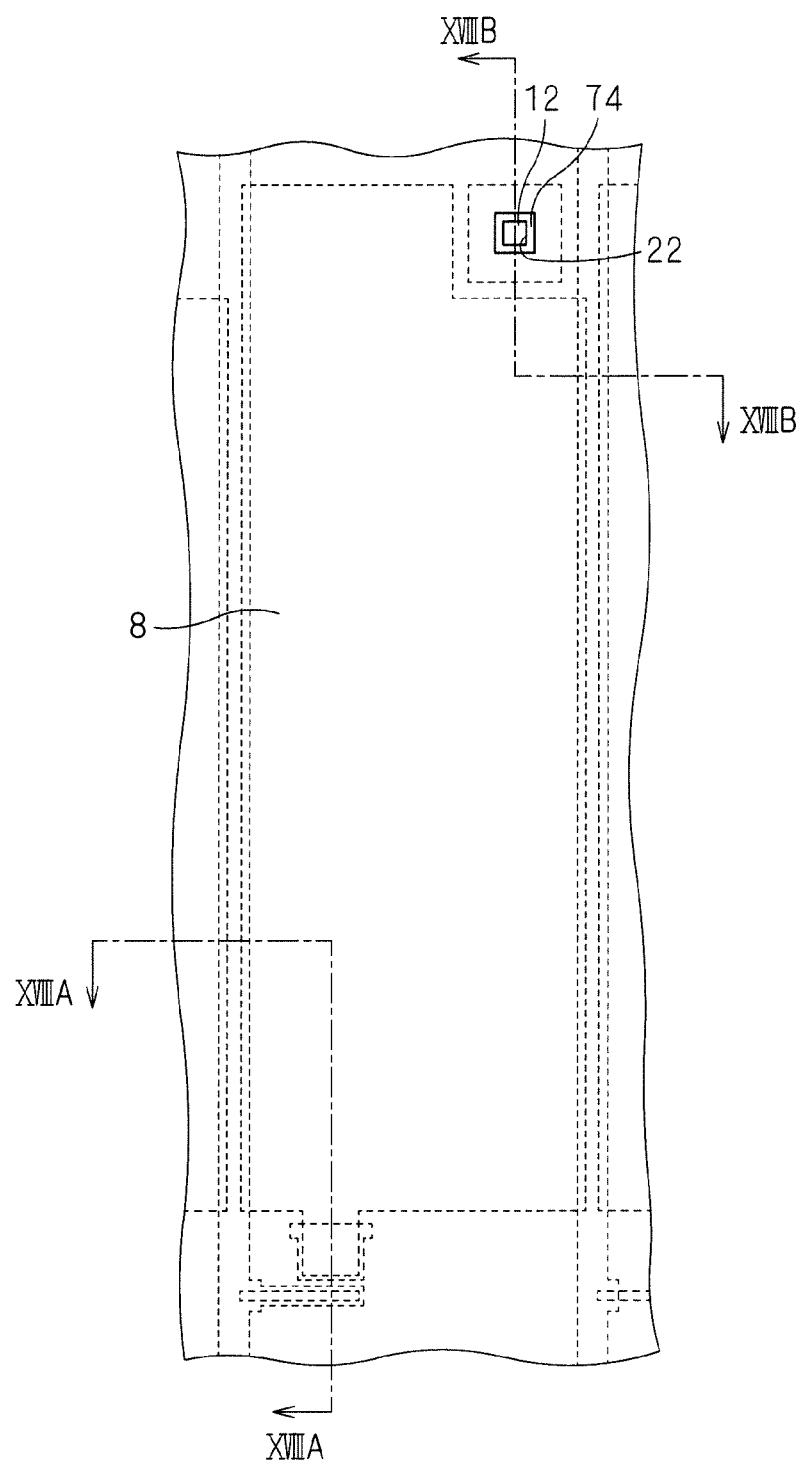
FIG. 17 is a partial plan view schematically showing a sixth process of the method for manufacturing the array substrate included in the liquid crystal panel according to the first preferred embodiment of the present invention.
Figure 18A:
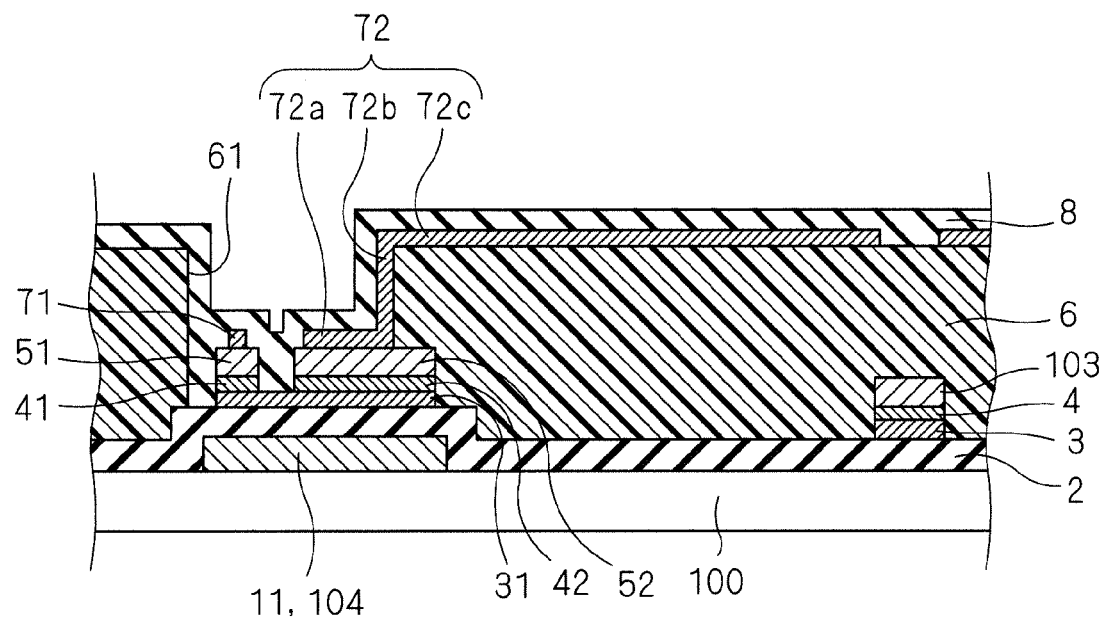
FIGS. 18A and 18B are schematic cross-sectional views respectively taken along the line XVIIIA-XVIIIA and the line XVIIIB-XVIIIB in FIG. 17.
Figure 18B:
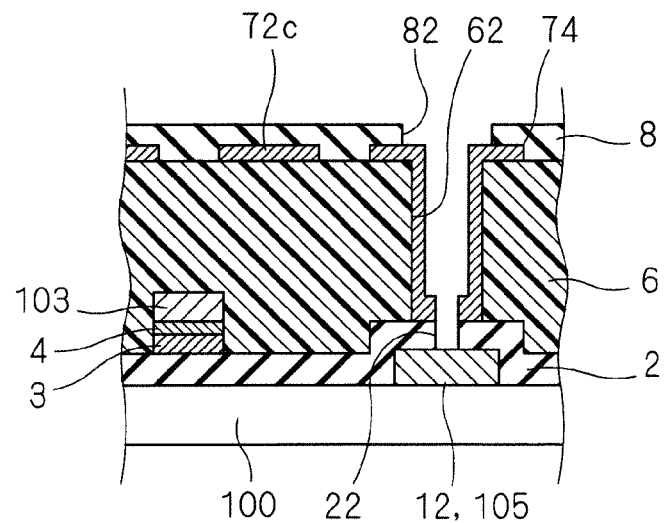
Figure 19:
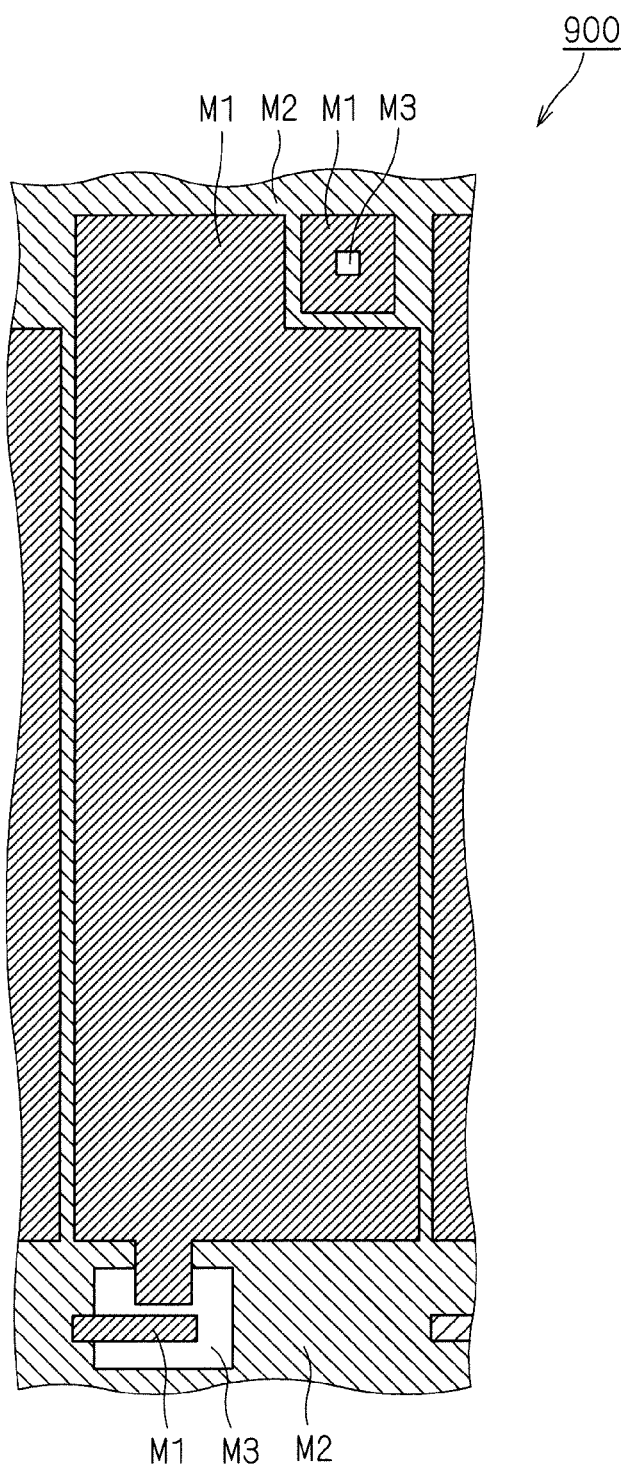
FIG. 19 is a partial plan view schematically showing a configuration of a photomask for photolithography in FIG. 13.

With reference to FIGS. 17, 18A, and 18B, the interlayer insulating film 8 that covers the pixel electrodes 72 is formed. The film may be formed by, for example, plasma CVD. Then, a fifth photolithography process is performed. Specifically, the opening 82 of the interlayer insulating film 8 and the opening 22 of the gate insulating film 2 are formed by etching.

Referring back to FIGS. 16A and 16B, the common electrode 91 is formed on the interlayer insulating film 8. Specifically, the transparent conductive film is formed and patterned by a sixth photolithography process. Consequently, the array substrate 201 is provided.

Comparative Example

With reference to FIG. 14A, assume that the formation of the source electrode 51 and the drain electrode 52 that are separated from each other and the formation of the dummy electrode 71 and the pixel electrode 72 respectively located on the source electrode 51 and the drain electrode 52 are completed by a single etching. In a case where the electrode film 50 that is to become the source electrode 51 and the drain electrode 52 is made of the material that is easier to be etched than that of the transparent conductive film 7 that is to become the dummy electrode 71 and the pixel electrode 72, a shape (hereinafter referred to as eaves shape) in which the dummy electrode 71 and the pixel electrode 72 overhang respectively from the source-electrode side surface 51S and the drain-electrode side surface 52S is inadvertently formed as shown in FIG. 20A. This phenomenon is prone to occur especially when the electrode film 50 is made of Al or Al alloy. The eaves shape is difficult sufficiently cover with the interlayer insulating film 8 (FIG. 18A). The eaves shape is positioned in the vicinity of the channel of the TFT 106. Therefore, the insufficient coverage of the eaves shape is likely to cause operation failure of the TFT 106. The operation failure of the TFT 106 deteriorates the display quality of the liquid crystal display panel in some cases.

Operation and Effect

Unlikely to the comparative example mentioned above, the above-described eaves shape is prevented from being formed in this preferred embodiment. Contrary to the above, a shape (hereinafter referred to as terrace shape) in which the source-electrode side surface 51S and the drain-electrode side surface 52S (FIG. 20B) overhang respectively from the dummy electrode 71 and the pixel electrode 72 is formed. The terrace shape is easily covered sufficiently with the interlayer insulating film 8 (FIG. 18A). Therefore, the reduction in yields caused by the insufficient coverage can be suppressed.

The interlayer insulating film 8 has excellent covering properties as mentioned above. Therefore, the interlayer insulating film 8 can be reduced in thickness while keeping the function as the protective film for the TFT 106. Consequently, the voltage required to generate the desired fringe fields is reduced, whereby the power consumption of the liquid crystal display panel 300 (FIG. 1) can be suppressed.

To form the above-mentioned terrace shape, the transparent conductive film 7 and the electrode film 50 are etched using the photoresist pattern PR2 (FIG. 14A), and then, the transparent conductive film 7 (namely, the pixel electrode 72) is narrowed by the follow-up etching in which the photoresist pattern PR2N that has been narrowed is used. That is, by the follow-up etching, the dummy electrode 71 and the pixel electrode 72 are set back inside the source-electrode side surface 51S and the drain-electrode side surface 52S, respectively. The narrowing of the photoresist pattern PR2 can be simultaneously performed with the ashing for removing the photoresist pattern PR1 causing less load weighing on the processes. The narrowing does not require an independent photolithography process, so that variations in positions do not occur due to superposition errors upon exposure to light. Thus, the narrowing can be performed with high accuracy.

In this preferred embodiment, the pixel electrode 72 has the contact portion 72a that is in contact with the drain electrode 52 in the opening 61 of the organic insulating film 6, the wiring portion 72b that extends directly on the side wall of the organic insulating film 6 from the contact portion 72a, and the body portion 72c that is linked to the wiring portion 72b and is located on the organic insulating film 6. This configuration can prevent the pixel electrode 72 from being interrupted at some midpoint due to variations in the manufacturing processes. Therefore, the manufacturing yields can be improved.

Particularly, the taper angle TA (FIG. 21) is provided in the organic insulating film 6, so that the wiring portion 72b that links the contact portion 72a and the body portion 72c can be more reliably formed. The sufficient amount of the taper angle TA can be easily provided in the organic insulating film 6 by heat treatment because the organic insulating film 6 is made of an organic matter.

Assume that the pixel electrode 72 is formed to extend from the contact portion 72a, pass through the portion on the gate insulating film 2, and extend on the side wall of the organic insulating film 6. In this case, the pixel electrode 72 follows the complicated path, so that the pixel electrode may be interrupted at some midpoint, particularly on boundaries between the layers, due to variations in the manufacturing processes. Therefore, the manufacturing yields can be reduced.

In this preferred embodiment, the photoresist pattern PR1 (FIGS. 14A and 14B) is formed only outside the openings 61 and 62 of the organic insulating film 6. That is, the photoresist pattern PR1 is not formed in the openings 61 and 62. The reason for this is that the photoresist pattern PR1 that is thin is difficult to form in the openings 61 and 62 having the level difference corresponding to the film thickness of the organic insulating film 6. By forming the photoresist pattern PR1 only outside the openings 61 and 62, the malformation of the pattern shape caused by the level difference can be avoided.

As shown in FIGS. 14A and 14B, the transparent conductive film 7 in the opening 61 is etched, and then, the source electrode 51 and the drain electrode 52 that are separated from each other are formed above the semiconductor film 31. If the organic insulating film 6 is exposed at this time, in other words, during the formation of the back channel, etching damage is caused to the exposed part of the organic insulating film 6. For example, if the photoresist film 500 has only the photoresist pattern PR2 and does not have the photoresist pattern PR1, the above-mentioned etching damage is caused. In this preferred embodiment, meanwhile, the photoresist pattern PR1 and the transparent conductive film 7 located thereunder protect the organic insulating film 6 from the damage caused by the etching for forming the channel. This can avoid abrasion, poor smoothness, and deformation of the organic insulating film 6 caused by the etching damage. Therefore, the organic insulating film 6 is further leveled, whereby the alignment film 361a formed thereon can also be leveled. Thus, the yields or the display quality can be prevented from being reduced or degraded due to the poor rubbing treatment of the alignment film 361a.

As described above, the organic insulating film 6 on the signal lines 103 is protected, so that the damage on the signal lines 103 can also be avoided. Therefore, the yields can be prevented from being reduced due to damages on the signal lines 103.

As described above, the interlayer insulating film 8 functions as the protective insulating film for the TFT 106 and the organic insulating film 6 functions as the protective film for the signal line 103. This can eliminate the need to form a film having only such a protective function. The manufacturing method is thus simplified.

As described above, the photolithography processes can be reduced to a minimum of six times. This can reduce the manufacturing costs.

As shown in FIG. 6A, the pixel electrode 72 is disposed between the insulating substrate 100 and the common electrode 91. Thus, as shown in FIG. 22A, a large proportion of the pixel electrode 72 can be used as an effective region EA in generating the electric fields required for liquid crystal driving. In other words, the aperture ratio of the liquid crystal display panel 300 (FIG. 1) can be increased.

If the common electrode is disposed between the insulating substrate and the pixel electrode (a pixel electrode 721 in FIG. 22B), the proportion of an effective region EB to the pixel electrode becomes smaller as shown in FIG. 22B. The first reason for this is that the slits for generating fringe fields need to be formed in the pixel electrode 721, thereby requiring a redundant pattern 722 in the periphery. The second reason for this is that a region CR for forming a contact hole through which signals are applied onto the pixel electrode 721 needs to be secured.

Compared with the FIG. 22B, FIG. 22A (this preferred embodiment) has an effective region increased by several percent to about ten percent, thus having a higher aperture ratio. This leads to improvements in display quality such as enhanced brightness, improved contrast consequent thereon, and improved viewing angle.

Although, in this preferred embodiment, the description has been given on the case in which the positive resist is exposed using the multi-tone mask 900, a negative resist may be exposed by inverting the light and dark patterns of the multi-tone mask 900.

Second Preferred Embodiment

Figure 6B:
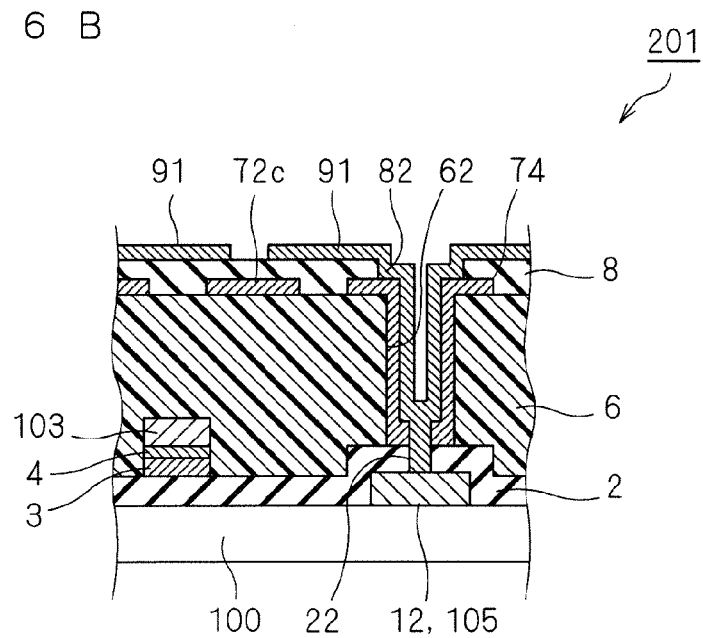
Figure 23A:
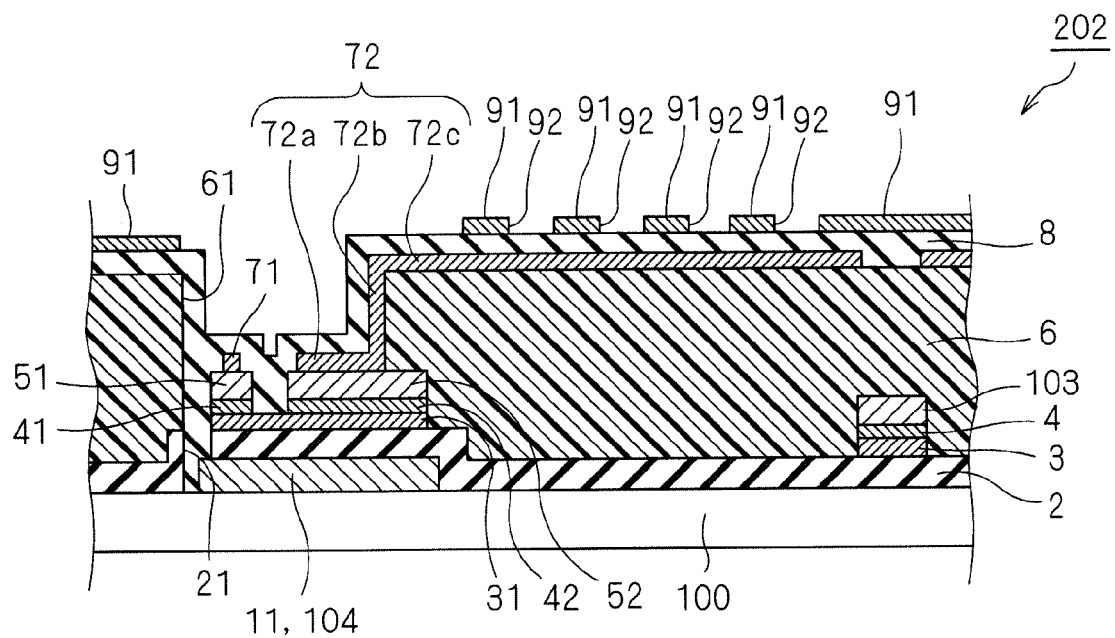
FIGS. 23A and 23B are partial cross-sectional views schematically showing a configuration of an array substrate included in a liquid crystal display panel according to a second preferred embodiment of the present invention, FIG. 23A corresponding to a visual field of FIG. 6A and FIG. 23B corresponding to a visual field of FIG. 6B.
Figure 23B:
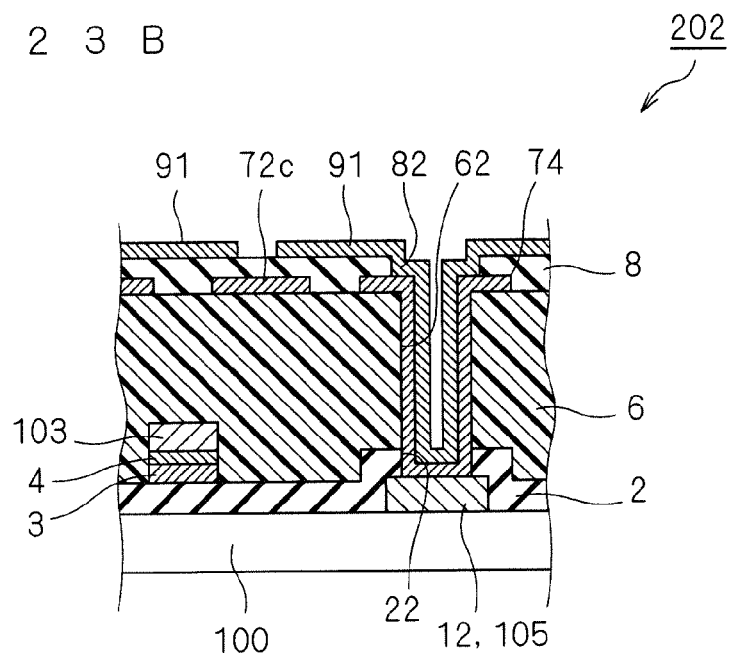

FIGS. 23A and 23B show a configuration of an array substrate 202 according to this preferred embodiment, respectively corresponding to the visual fields of FIGS. 6A and 6B in the first preferred embodiment.

With reference to FIG. 23A, in the array substrate 202 according to this preferred embodiment, the gate insulating film 2 has an opening 21 in the opening 61 of the organic insulating film 6. The interlayer insulating film 8 reaches the insulating substrate 100 in the opening 21.

With reference to FIG. 23B, the conductive film 74 is in contact with the contact electrode 12 in the opening 22 of the gate insulating film 2. The opening 22 of the gate insulating film 2 has the same size as that of the opening 62 of the organic insulating film 6. Therefore, the contact area of the contact composed of the conductive film 74 and the common electrode 91 on the contact electrode 12 is increased when compared with that of the first preferred embodiment. The contact resistance can be thus suppressed.

The configuration except for the above is about the same as the configuration of the array substrate 201 according to the first preferred embodiment described above. Therefore, the same or corresponding elements are given the same reference signs and the description thereof is not repeated. The array substrate 202 may substitute for the array substitute 201 in the liquid crystal display panel 300 (FIG. 1).

Figure 24A:
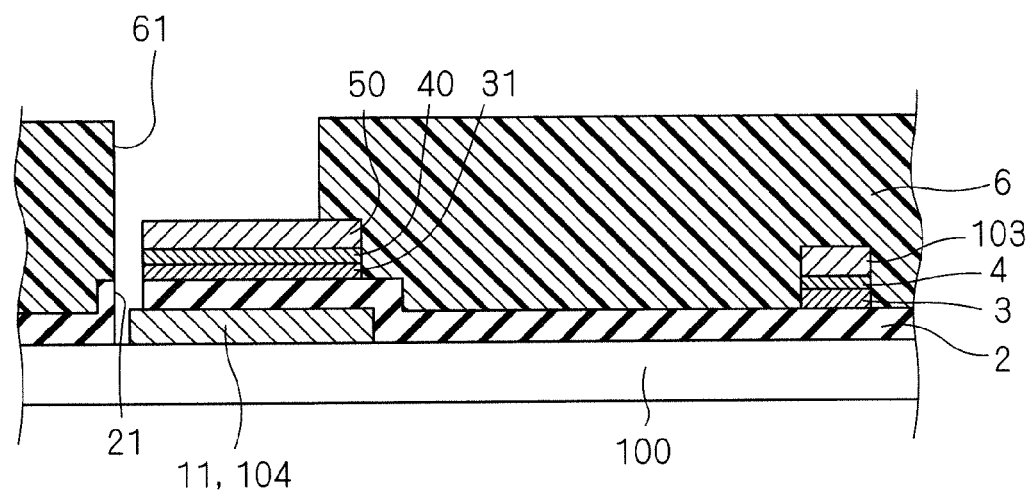
FIGS. 24A and 24B are partial cross-sectional views schematically showing one process of a method for manufacturing the array substrate included in the liquid crystal panel according to the second preferred embodiment of the present invention, FIG. 24A corresponding to a visual field of FIG. 23A and FIG. 24B corresponding to a visual field of FIG. 23B.
Figure 24B:
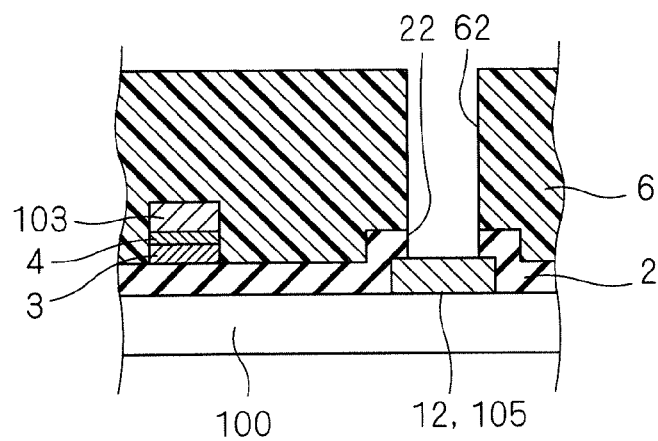

With reference to FIGS. 24A and 24B, in manufacturing the array substrate 202 mentioned above, a dry etching is performed using the organic insulating film 6 as a mask. Consequently, the openings 21 and 22 are formed in the gate insulating film 2. The effects of the dry etching on the organic insulating film 6 are substantially consistent across the entirety of the organic insulating film 6. Thus, while the organic insulating film 6 is damaged, the deformation such as generation of a step hardly occurs therein. Then, similarly to the first preferred embodiment, the pixel electrode 72, the interlayer insulating film 8, and the common electrode 91 are formed.

Third Preferred Embodiment

Figure 25A:
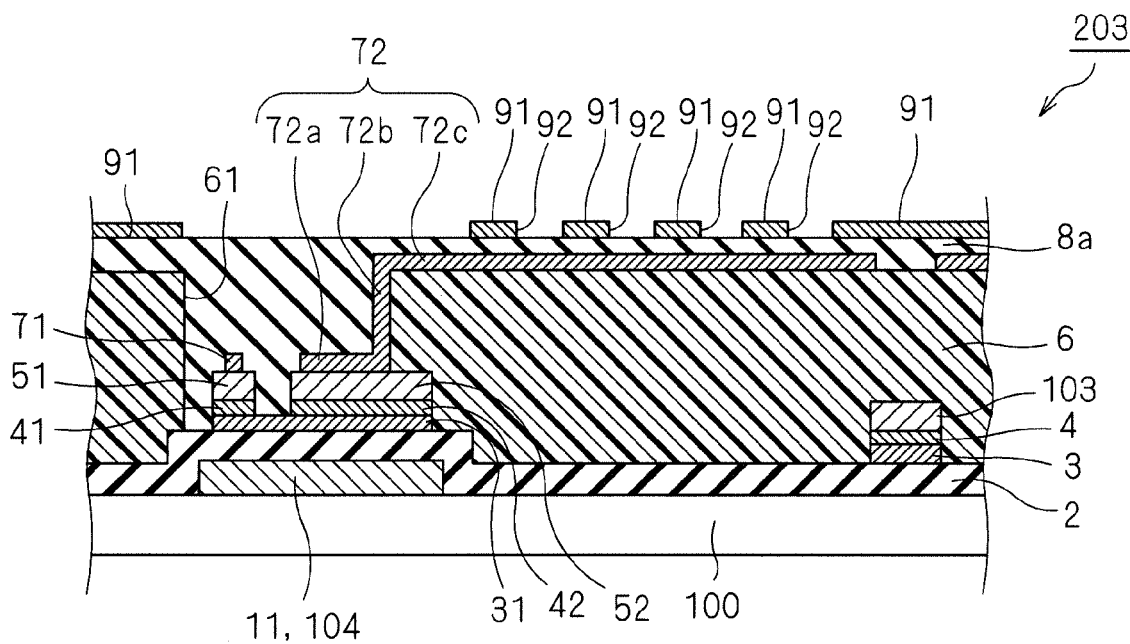
FIGS. 25A and 25B are partial cross-sectional views schematically showing a configuration of an array substrate included in a liquid crystal panel according to a third preferred embodiment of the present invention, FIG. 25A corresponding to the visual field of FIG. 6A and FIG. 25B corresponding to the visual field of FIG. 6B.
Figure 25B:
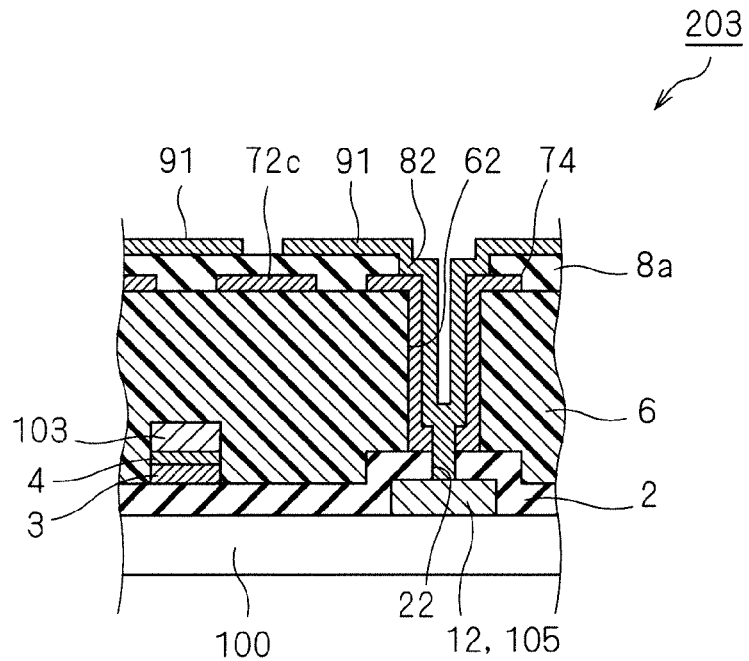

With reference to FIGS. 25A and 25B, an array substrate 203 according to this preferred embodiment includes, in place of the interlayer insulating film 8 described above, an interlayer insulating film 8a that is a coating-type spin-on glass film (SOG film). The SOG film has the SiC composition, thereby having the low dielectric constant ($\in$=3 to 3.5). Thus, if the fringe voltage is 6 to 7 V, the film thickness needs to be not more than 500 nm in order to obtain the sufficient fringe fields. The coating-type SOG film has excellent leveling properties, thereby being easily thinned on the organic insulating film 6. The opening 61 of the organic insulating film 6 can be buried in the SOG film that is locally thickened, so that most of the display region 101 (FIG. 2) can be leveled. This can uniform the film thickness of the alignment film 361a (FIG. 1) and the rubbing treatment of the alignment film 361a. The SOG film is present on the TFT 106, whereby the parasitic capacitance can be reduced.

The configuration except for the above is about the same as the configuration in the first or second preferred embodiment described above. Therefore, the same or corresponding elements are given the same reference signs and the description thereof is not repeated. The array substrate 203 may substitute for the array substitute 201 in the liquid crystal display panel 300 (FIG. 1).

In the present invention, the above preferred embodiments can be arbitrarily combined, or each preferred embodiment can be appropriately varied or omitted within the scope of the invention.

While the invention has been shown and described in detail, the foregoing description is in all aspects illustrative and not restrictive. It is therefore understood that numerous modifications and variations can be devised without departing from the scope of the invention.

What is claimed is:
1. A liquid crystal display panel comprising:
an insulating substrate;
a gate electrode located on said insulating substrate;
a gate insulating film that covers said gate electrode above said insulating substrate;
a semiconductor film that is partially located on said gate insulating film and is opposed to said gate electrode via said gate insulating film;
a signal line located above said insulating substrate;
a source electrode partially located above said semiconductor film, said source electrode being linked to said signal line;
a drain electrode located above said semiconductor film apart from said source electrode;
said source electrode and said drain electrode having a source-electrode side surface and a drain-electrode side surface, respectively, said source-electrode side surface and said drain-electrode side surface being opposed to each other with a gap therebetween in an opposition direction above said semiconductor film,
an organic insulating film that covers said signal line above said insulating substrate, said organic insulating film having an opening through which said drain electrode is partially exposed, said opening has a side wall extending from above said drain electrode;
a pixel electrode having a contact portion that is in contact with said drain electrode in said opening of said organic insulating film, a wiring portion that extends directly on said side wall of said organic insulating film from said contact portion, and a body portion that is linked to said wiring portion and is located on said organic insulating film, said pixel electrode being formed of a transparent conductor as one continuous pattern in each pixel;
an interlayer insulating film that covers said pixel electrode, said interlayer insulating film covering said source electrode and directly covering said semiconductor film between said source-electrode side surface and said drain-electrode side surface; and
a common electrode located on said interlayer insulating film, said common electrode having fringes opposed to said pixel electrode via said interlayer insulating film.

2. The liquid crystal display panel according to claim 1, wherein said opening of said organic insulating film has a shape tapering toward said insulating substrate.

3. The liquid crystal display panel according to claim 1, wherein said organic insulating film is made of a resin having photosensitivity.

4. The liquid crystal display panel according to claim 1, wherein
said pixel electrode has a pixel-electrode end part as an end part in said opposition direction in said opening of said organic insulating film, and said pixel-electrode end part is positioned on said drain electrode inside said drain-electrode side surface, forming a step part.

5. The liquid crystal display panel according to claim 4, further comprising a dummy electrode located on said source electrode, said dummy electrode being made of a material that is identical to a material for said pixel electrode, wherein
said dummy electrode has, in said opening of said organic insulating film, a dummy-electrode end part being opposed to said pixel-electrode end part, and
said dummy-electrode end part is positioned inside said source-electrode side surface.

6. The liquid crystal display panel according to claim 1, wherein said interlayer insulting film is a spin-on glass film.

7. The liquid crystal display panel according to claim 1, further comprising a dummy electrode located on said source electrode, said dummy electrode being made of a material that is identical to a material for said pixel electrode.

8. The liquid crystal display panel according to claim 1, wherein said interlayer insulating film covers a whole region in said opening of said organic insulating film.

9. A liquid crystal display panel comprising:
an insulating substrate;
a gate electrode located on said insulating substrate;
a gate insulating film that covers said gate electrode above said insulating substrate;
a semiconductor film that is partially located on said gate insulating film and is opposed to said gate electrode via said gate insulating film;
a signal line located above said insulating substrate;
a source electrode partially located above said semiconductor film, said source electrode being linked to said signal line;
a drain electrode located above said semiconductor film apart from said source electrode;
said source electrode and said drain electrode having a source-electrode side surface and a drain-electrode side surface, respectively, said source-electrode side surface and said drain-electrode side surface being opposed to each other with a gap therebetween in an opposition direction above said semiconductor film,
an organic insulating film that covers said signal line above said insulating substrate, said organic insulating film having an opening through which said drain electrode is partially exposed, said opening has a side wall extending from above said drain electrode;
a pixel electrode having a contact portion that is in contact with said drain electrode in said opening of said organic insulating film, a wiring portion that extends directly on said side wall of said organic insulating film from said contact portion, and a body portion that is linked to said wiring portion and is located on said organic insulating film, said pixel electrode being formed of a transparent conductor;
an interlayer insulating film that covers said pixel electrode, said interlayer insulating film covering said source electrode and directly covering said semiconductor film between said source-electrode side surface and said drain-electrode side surface;
a common electrode located on said interlayer insulating film, said common electrode having fringes opposed to said pixel electrode via said interlayer insulating film; and a dummy electrode located on said source electrode, said dummy electrode being made of a material that is identical to a material for said pixel electrode, wherein
said pixel electrode has a pixel-electrode end part as an end part in said opposition direction in said opening of said organic insulating film,
said pixel-electrode end part is positioned on said drain electrode inside said drain-electrode side surface,
said dummy electrode has, in said opening of said organic insulating film, a dummy-electrode end part being opposed to said pixel-electrode end part, and
said dummy-electrode end part is positioned inside said source-electrode side surface.

10. A liquid crystal display panel comprising:
an insulating substrate;
a gate electrode located on said insulating substrate;
a gate insulating film that covers said gate electrode above said insulating substrate;
a semiconductor film that is partially located on said gate insulating film and is opposed to said gate electrode via said gate insulating film;
a signal line located above said insulating substrate;
a source electrode partially located above said semiconductor film, said source electrode being linked to said signal line;
a drain electrode located above said semiconductor film apart from said source electrode;
said source electrode and said drain electrode having a source-electrode side surface and a drain-electrode side surface, respectively, said source-electrode side surface and said drain-electrode side surface being opposed to each other with a gap therebetween in an opposition direction above said semiconductor film,
a leveling insulating film that covers said signal line above said insulating substrate and levels a surface, said leveling insulating film having an opening through which said drain electrode is partially exposed, said opening has a side wall extending from above said drain electrode;
a pixel electrode having a contact portion that is in contact with said drain electrode in said opening of said leveling insulating film, a wiring portion that extends directly on said side wall of said leveling insulating film from said contact portion, and a body portion that is linked to said wiring portion and is located on said leveling insulating film, said pixel electrode being formed of a transparent conductor as one continuous pattern in each pixel;
an interlayer insulating film that covers said pixel electrode, said interlayer insulating film covering said source electrode and directly covering said semiconductor film between said source-electrode side surface and said drain-electrode side surface; and
a common electrode located on said interlayer insulating film, said common electrode having fringes opposed to said pixel electrode via said interlayer insulating film.

11. The liquid crystal display panel according to claim 10, wherein said opening of said leveling insulating film has a shape tapering toward said insulating substrate.

12. The liquid crystal display panel according to claim 10, wherein said leveling insulating film is made of an insulator having photosensitivity.

13. The liquid crystal display panel according to claim 10, wherein said leveling insulating film has a dielectric constant lower than a dielectric constant of said gate insulating film.

14. The liquid crystal display panel according to claim 10, wherein said leveling insulating film has a thickness of 2 to 4 μm.

15. The liquid crystal display panel according to claim 10, wherein
   said pixel electrode has a pixel-electrode end part as an end part in said opposition direction in said opening of said leveling insulating film, and
   said pixel-electrode end part is positioned on said drain electrode inside said drain- electrode side surface, forming a step part.

16. The liquid crystal display panel according to claim 15, further comprising a dummy electrode located on said source electrode, said dummy electrode being made of a material that is identical to a material for said pixel electrode, wherein
   said dummy electrode has, in said opening of said leveling insulating film, a dummy- electrode end part being opposed to said pixel-electrode end part, and
   said dummy-electrode end part is positioned inside said source-electrode side surface.

17. The liquid crystal display panel according to claim 10, wherein said interlayer insulting film is a spin-on glass film.

18. The liquid crystal display panel according to claim 10, further comprising a dummy electrode located on said source electrode, said dummy electrode being made of a material that is identical to a material for said pixel electrode.

19. The liquid crystal display panel according to claim 10, wherein said interlayer insulating film covers a whole region in said opening of said leveling insulating film.

* * * * *